US007044752B2

(12) United States Patent
Olson et al.

(10) Patent No.: US 7,044,752 B2
(45) Date of Patent: May 16, 2006

(54) RECEPTACLE

(75) Inventors: Stanley W. Olson, East Berlin, PA (US); Stuart C. Stoner, Lewisberry, PA (US)

(73) Assignee: FCI Americas Technology, Inc., Reno, NV (US)

( * ) Notice: Subject to any disclaimer, the term of this patent is extended or adjusted under 35 U.S.C. 154(b) by 64 days.

(21) Appl. No.: 10/391,387

(22) Filed: Mar. 18, 2003

(65) Prior Publication Data

US 2004/0048510 A1 Mar. 11, 2004

Related U.S. Application Data

(60) Provisional application No. 60/383,366, filed on May 24, 2002, provisional application No. 60/383,490, filed on May 24, 2002.

(51) Int. Cl.
*H01R 12/00* (2006.01)
*H05K 1/00* (2006.01)

(52) U.S. Cl. .......................................................... 439/79

(58) Field of Classification Search .................. 439/79, 439/80

See application file for complete search history.

(56) References Cited

U.S. PATENT DOCUMENTS 4,875,863 A * 10/1989 Reed ........................... 439/79
5,785,557 A 7/1998 Davis ......................... 439/660
5,931,687 A 8/1999 McFarlane et al. ........... 439/79
5,947,754 A 9/1999 Lin ............................ 439/79
5,951,306 A 9/1999 Millhimes .................... 439/79
6,106,338 A 8/2000 Wu et al. ..................... 49/660
6,270,379 B1 8/2001 Huang et al. ............... 439/660

OTHER PUBLICATIONS

U.S. Appl. No. 60/379,353, filed May 10, 2002, Simpson.
U.S. Appl. No. 60/383,366, filed May 24, 2002, Olson.
U.S. Appl. No. 60/383,403, filed May 24, 2002, Sercu.
U.S. Appl. No. 60/383,490, filed May 24, 2002, Olson.

* cited by examiner

*Primary Examiner*—Javaid H. Nasri
(74) *Attorney, Agent, or Firm*—Woodcock Washburn LLP

(57) ABSTRACT

A receptacle comprises a receptacle housing having a body, a plug interface portion extending therefrom, and a contact support member with pivot areas formed therein for urging contacts disposed in the housing into alignment. A receptacle further comprises a shielding shell having cantilevered beams formed therein. The shielding shell has a projection extending therefrom for contacting a latch arm extending from the receptacle housing. A shielding gasket is disposed around the shielding shell and has overlapping rows of beams extending therefrom. The shielding gasket also has a projection extending therefrom that is situated in a channel formed in a latch arm. The latch arm is formed as part of a latch plate comprising a latch bar, two latch arms, and at least one projection for contacting ground.

7 Claims, 35 Drawing Sheets

RECEPTACLE

CROSS REFERENCE TO RELATED APPLICATIONS

This application claims the benefit of U.S. Provisional Patent Application 60/383,366 filed May 24, 2002 and entitled "Improved Receptacle," and U.S. Provisional Patent Application 60/383,490 filed May 24, 2002 and entitled "Improved Plug," the contents of which are hereby incorporated by reference in their entirety.

This application is related by subject matter to U.S. patent application Ser. No. 10/391,388 filed on Mar. 18, 2003 and entitled "Improved Plug," U.S. Patent Application 60/383,403 filed on May 24, 2002 and entitled "Paddle-Card Termination for Shielded Cable," and U.S. Patent Application 60/379,353 filed on May 10, 2002 and entitled "Overmolded Strain Relief and Electrical," the contents of which are hereby incorporated by reference in their entirety.

FIELD OF THE INVENTION

The present invention relates to electrical connectors and more particularly to plugs and receptacles.

BACKGROUND

The speed and capacity of computing systems is constantly on the rise. Furthermore, computing systems are being interconnected in increasingly complex networks. In order to keep pace with these developments, new interconnect systems such as, for example, the InfiniBand architecture have been proposed. The InfiniBand architecture is an industry standard, channel-based, switched fabric, interconnect architecture, with a primary application in the area of server interconnection. InfiniBand promises to provide reliable interconnect performance at speeds ranging from 2.5 to 30 Gbits/second.

The InfiniBand standard, and others like it such as, for example, 10 Gbit Ethernet represent notable advances in interconnect speeds. At the lofty speeds provided by these technologies, the highest levels of electrical performance are required of the physical interconnect devices. For example, creating a stable contact interface with precise impedance matching is essential. Likewise, electromagnetic interference and leakage must be minimized. Furthermore, these characteristics must be provided in a physical form that is mechanically operable in real world situations and capable of being manufactured consistently in large quantities.

SUMMARY

Disclosed herein are improved interconnect systems. More particularly, disclosed herein are improved receptacles.

A disclosed exemplary receptacle comprises a housing having a body, an interface for receiving a plug, and a member, which may be referred to as a contact support member. The contact support member has a plurality of pivot areas formed therein. The receptacle further comprises signal contacts, which are inserted into the housing. A portion of each signal contact extends through the housing and is exposed in the interface, while a second portion of the signal contact abuts one of the pivot areas. The pressure applied by the pivot area urges at least a portion of each signal contact to become vertically and horizontally aligned.

A shielding shell is also disclosed herein for providing electrical continuity between the receptacle and a plug. The shielding shell is formed from a metallic material and has a plurality of projections formed therein which contact the metallic casing of a plug when connected thereto. At least a portion of each of the plurality of projections increases in height across the length of the projection. This feature improves contact between the shielding shell and the plug casing.

A latch member or arm extending from the housing and for mating with a corresponding latch member on a plug is also disclosed. The shielding shell may further comprise a projection extending therefrom, which contacts the latch member and thereby provides an electrical path between the shell and latch member.

An electrical shielding gasket is disposed on the receptacle housing and is formed around the plug interface. The gasket comprises a metallic frame and a first plurality of metallic beams extending from the frame and situated linearly along the frame with portions of the frame formed therebetween. The gasket further comprises a second plurality of metallic beams extending from the frame and situated linearly along the metallic frame. The second plurality of metallic beams span the portions of the frame between the first plurality of metallic beams. The gasket may still further comprise a locking member extending from the frame. The locking member extends into a recess, which may be a channel, formed in the latch member and thereby limits the movement of the gasket relative to the latch arm.

According to an aspect of the disclosed receptacle, the latch member is formed as part of a latch plate. The latch plate comprises a latch bar extending along said housing and a first and second latch member extending therefrom and through the housing. The latch bar provides protection to signal and ground contacts that are inserted in the housing. The latch plate further comprises two projections extending therefrom for connecting the latch plate to a device such as a circuit board. The projections may be connected to, for example, a ground on the circuit board. Electrical continuity within the receptacle as well as between a plug and the receptacle is provided through the latch arms, which extend into the latch bar, and terminate at ground via the projections.

Additional aspects of the disclosed exemplary receptacle are provided below.

BRIEF DESCRIPTION OF THE DRAWINGS

An exemplary receptacle is described with reference to the accompanying drawings in which.

DESCRIPTION OF ILLUSTRATIVE EMBODIMENTS

An exemplary plug and receptacle with the above-mentioned beneficial features are described below with reference to FIGS. 1 through 33. In particular, novel aspects of an exemplary receptacle are described in detail below. The description given herein with respect to the Figures is for illustrative purposes only and is not intended in any way to limit the scope of the potential embodiments. Questions regarding the scope of the potential embodiments may be resolved by referring to the appended claims.

Figure 1:
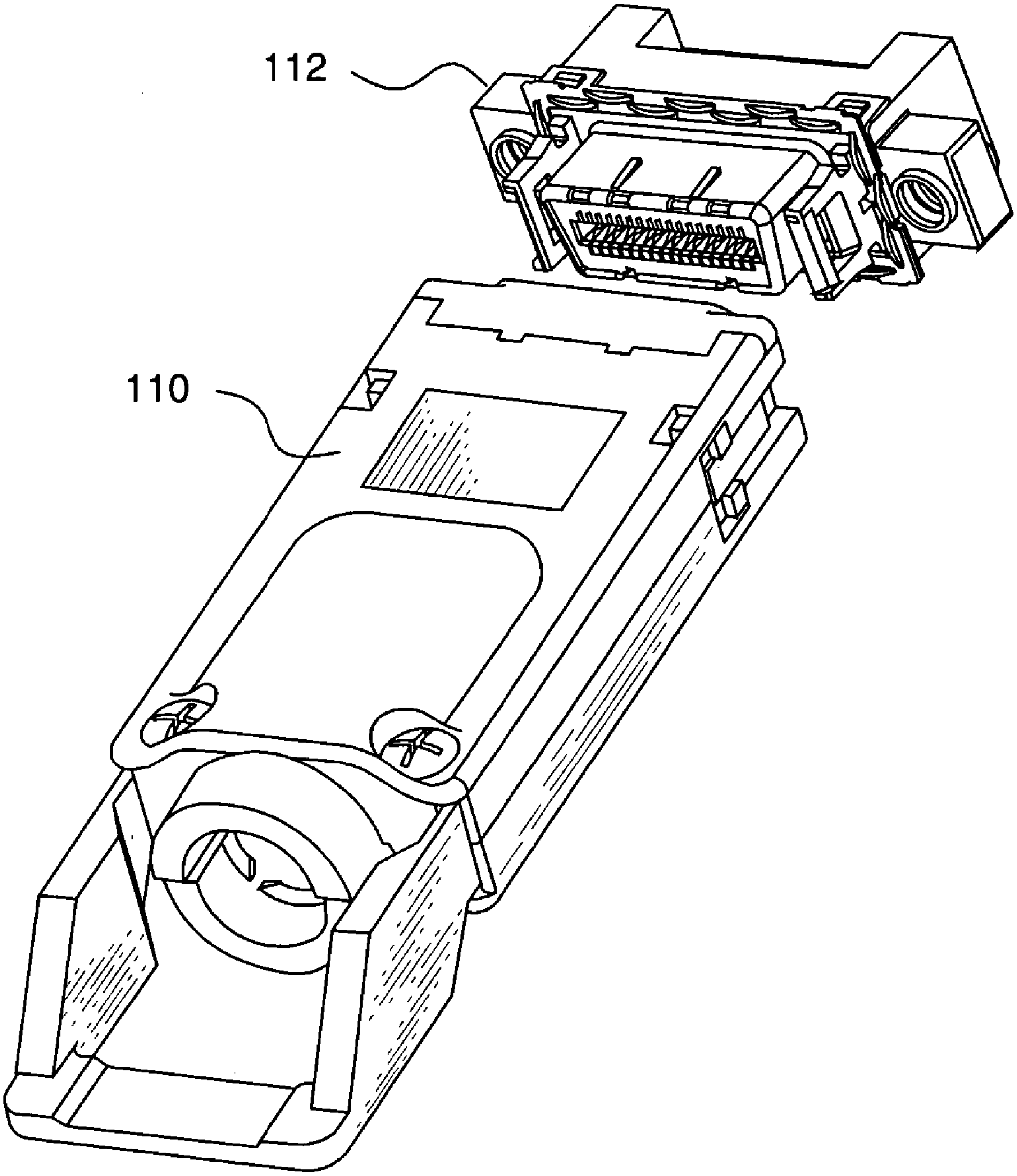
FIG. 1 is a perspective view of an exemplary plug aligned for interconnection with an exemplary receptacle.
Figure 2:
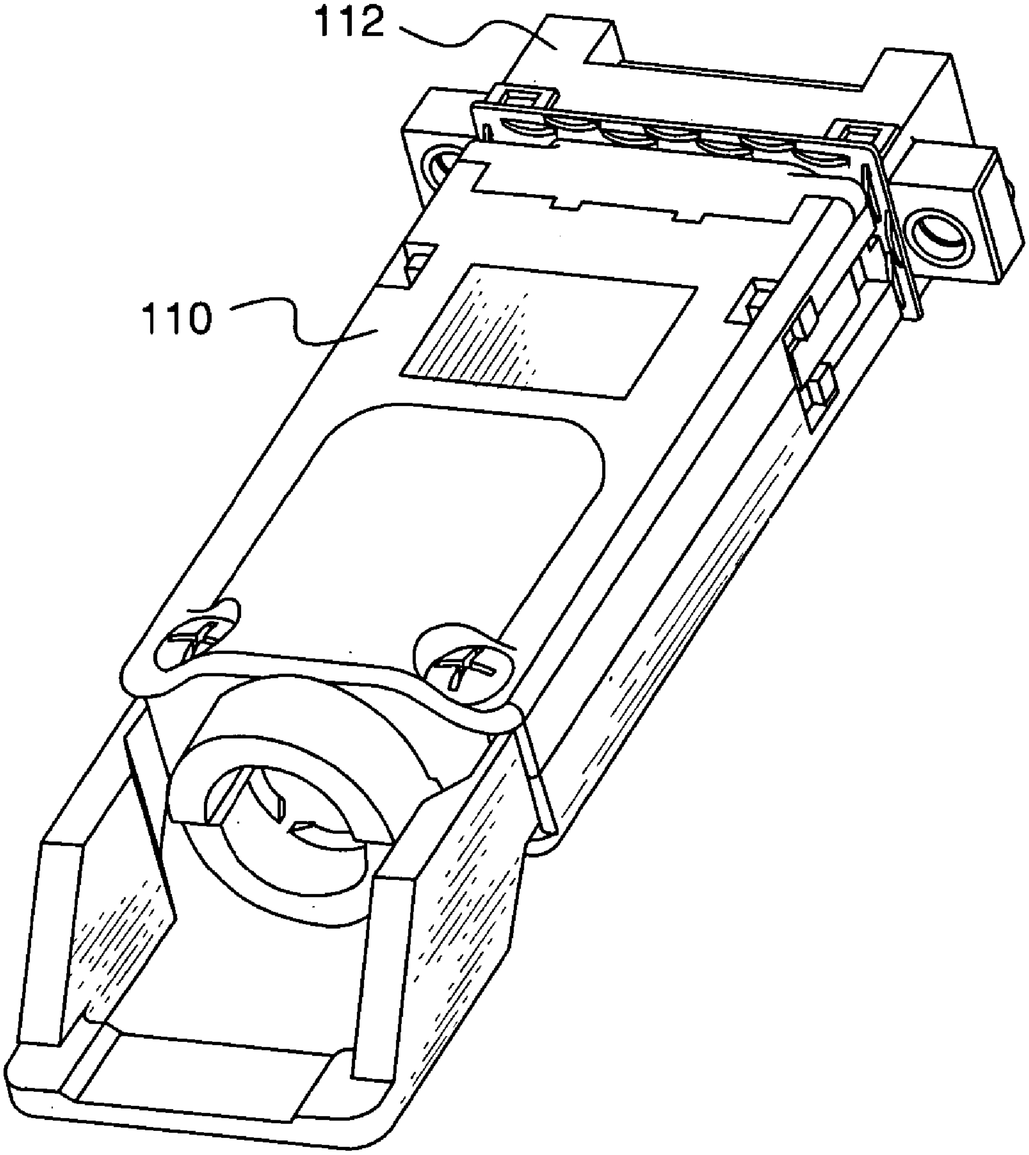
FIG. 2 is a perspective view of an exemplary plug interconnected with an exemplary receptacle.

FIG. 1 provides a perspective view of exemplary plug 110 aligned for interconnection with exemplary receptacle 112. Plug 110 serves as the terminating point for a plurality of wires incorporated in a cable (not shown). Receptacle 112 provides electrical connectivity to a device such as, for example, a printed circuit board. Plug 110 is inserted into receptacle 112 as shown in FIG. 2 so as to provide a communication path from plug 110 to the device to which receptacle 112 is connected.

Figure 3:
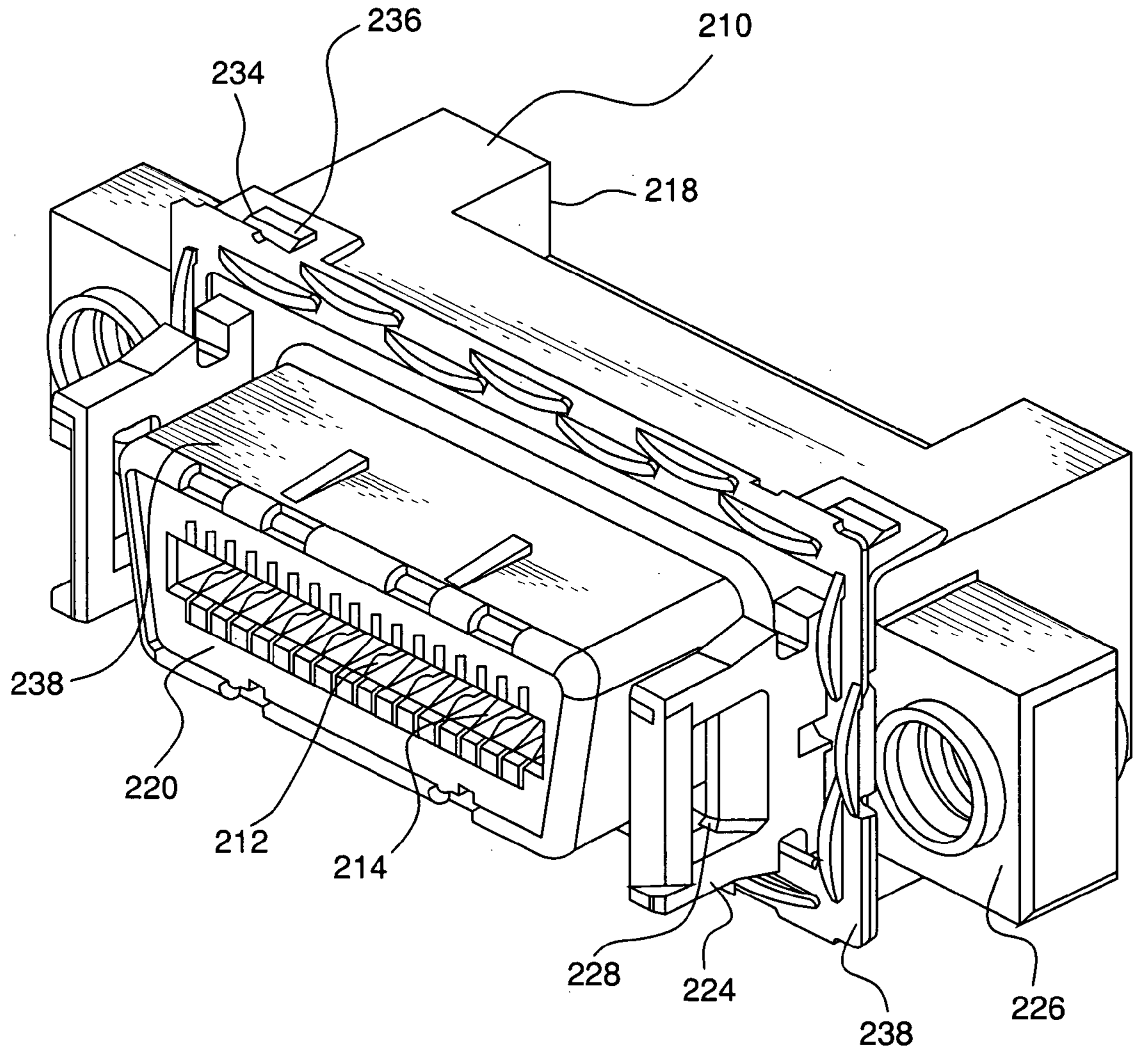
FIG. 3 is a front perspective view of an exemplary receptacle.
Figure 4:
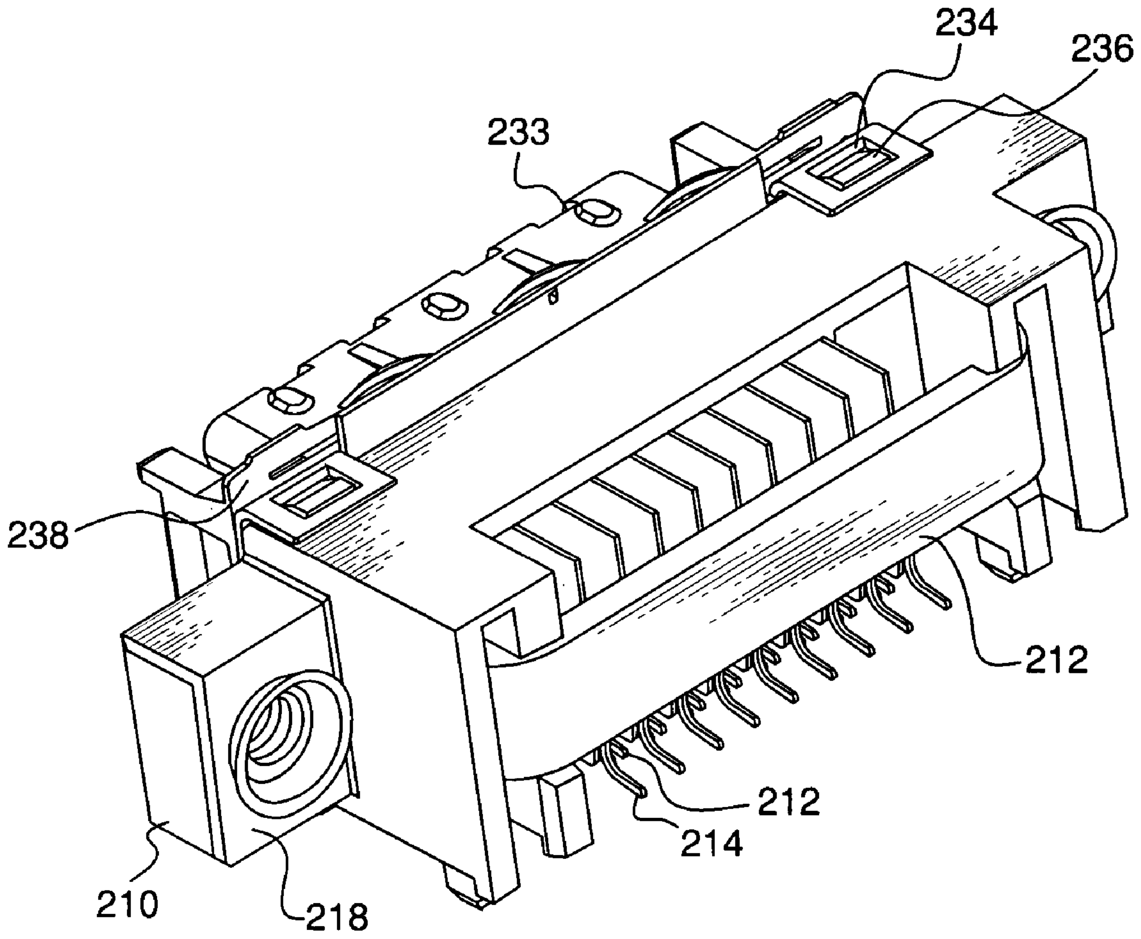
FIG. 4 is a rear perspective view of an exemplary receptacle.
Figure 5:
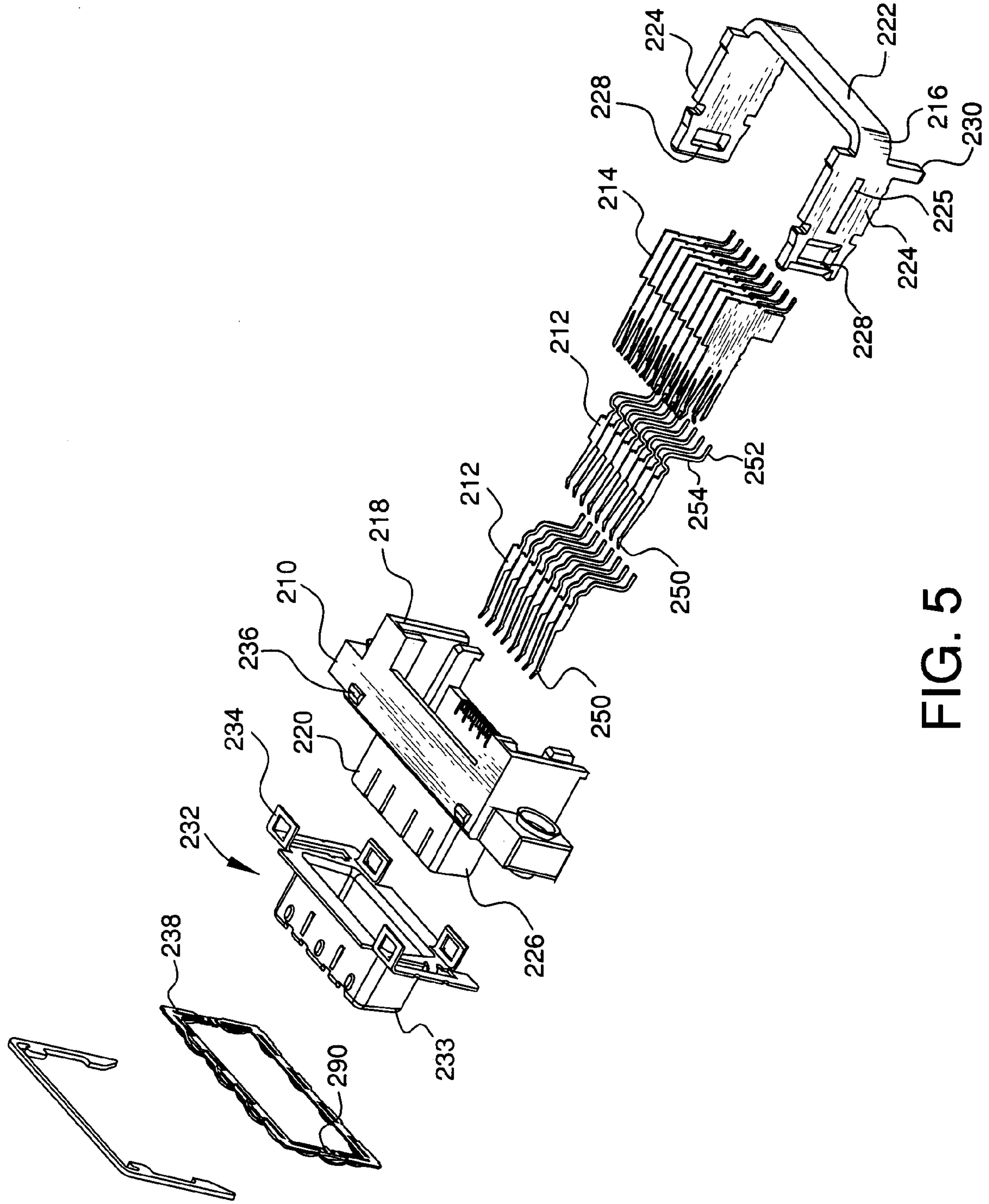
FIG. 5 is an exploded view of an exemplary receptacle.

Front, rear, and exploded views of receptacle 112 are provided in FIGS. 3, 4, and 5 respectively. As shown, receptacle 112 comprises receptacle housing 210 into which signal contacts 212, ground contacts 214, and latch plate 216 are inserted. Metallic signal contacts 212 and ground contacts 214 extend from rear side 218 of housing 210 into plug interface 220 portion of receptacle housing 210 and are secured in place by frictional coupling. Plug interface portion 220 has an area therein at which contacts 212 and 214 are exposed for the purpose of mating with corresponding contacts in plug 110. Receptacle housing 210 is manufactured from a high temperature thermo-plastic material such as, for example, liquid crystal polymer (LCP), and is operable to provide electrical isolation between contacts 212.

Latch plate 216 comprises latch bar 222 and latch members 224 extending therefrom. Latch members 224 extend through housing 210 and project from external side 226. Recesses 228 are formed in latch members 224 and are designed to receive corresponding latches 421 from plug assembly 210. Latch members 224 have channels 225 formed in their exterior surfaces for interacting with locking members 290 extending from electrical gasket 238. Latch plate 216, and in particular latch bar 222 extends across the rear of receptacle housing 210 and protects contacts 212 and 214 from unintentional manipulation. Generally, latch plate 216 is formed of a high strength conductive metal that can be soldered such as, for example, cold rolled steel (CRS), and further comprises grounding projections 230 for connecting to a ground contact on a device such as a printed circuit board.

Shielding shell 232 is formed to correspond to the exterior surface of plug interface portion 220 and is fitted thereto. Specifically, shell 232 comprises casing 233, which encapsulates the surface of interface portion 220. Receptacles 234 are formed in shell 232 and correspond to projections 236 formed in housing 210. Receptacles 234 frictionally interact with projections 236 to maintain shell 232 in position on plug interface portion 220. Shielding shell 232 is manufactured from a conductive material that is capable of being extruded such as, for example, cold rolled steel. Upon connection of plug 110 to receptacle 112, shielding shell 232 contacts the metallic casing of plug 110 and thereby reduces electromagnetic interference (EMI).

Gasket 238 fits around casing 233 of shielding shell 232. Gasket 238 is manufactured from a conductive material with spring characteristics such as, for example, phosphorous bronze, and has metal beams extending therefrom. When plug 110 is inserted into receptacle 112, the metal beams extending from gasket 238 overlap the casing of plug 110. Gasket 238 thereby operates to reduce electromagnetic forces (EMF's) escaping between plug 110 and receptacle 112 and maintains an equal ground potential between plug 110 and receptacle 112.

Signal contacts 212 comprises a plug contact portion 250 for making electrical contact with a corresponding contact in plug 110 and a tail portion 252 for electrically connecting receptacle 112 to a device such as a printed circuit board. Pivot member 254 is formed between the two. Tail portions 252 should be precisely aligned so as to facilitate connecting receptacle 112 to a device. Given the extremely delicate nature of contacts 212, maintaining the alignment of tail portions 252 throughout manufacturing and up until connection to an electrical device is a difficult proposition. Receptacle housing 210 disclosed herein is especially designed to maintain the desired alignment of tail portions 252.

Figure 6:
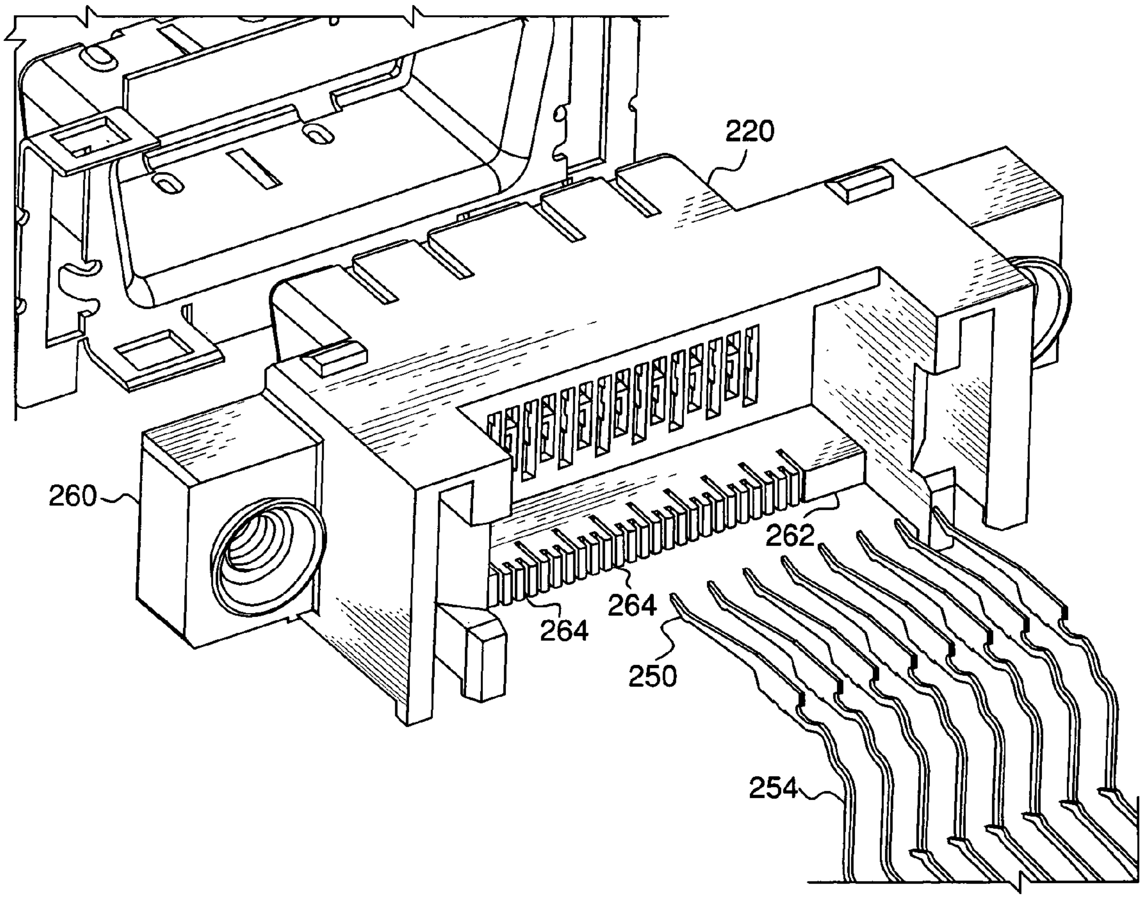
FIG. 6 is a rear view of an exemplary receptacle housing.
Figure 7A:
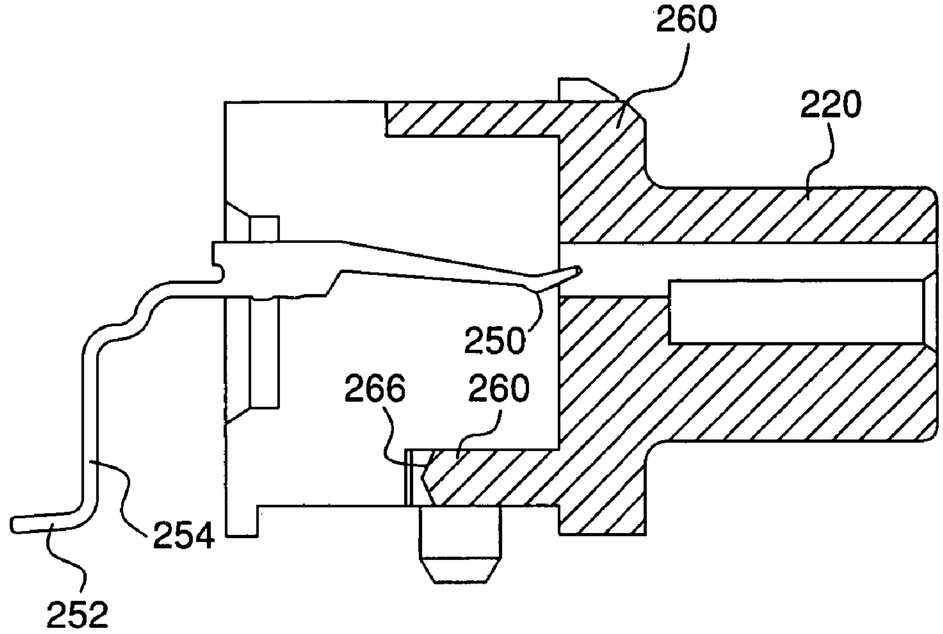
FIGS. 7A through 7D illustrate a signal contact at various stages of insertion into an exemplary receptacle housing.
Figure 7B:
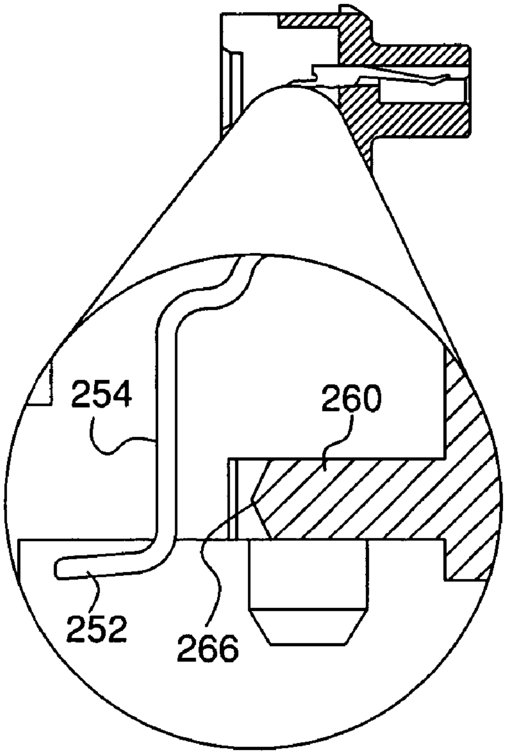
Figure 7C:
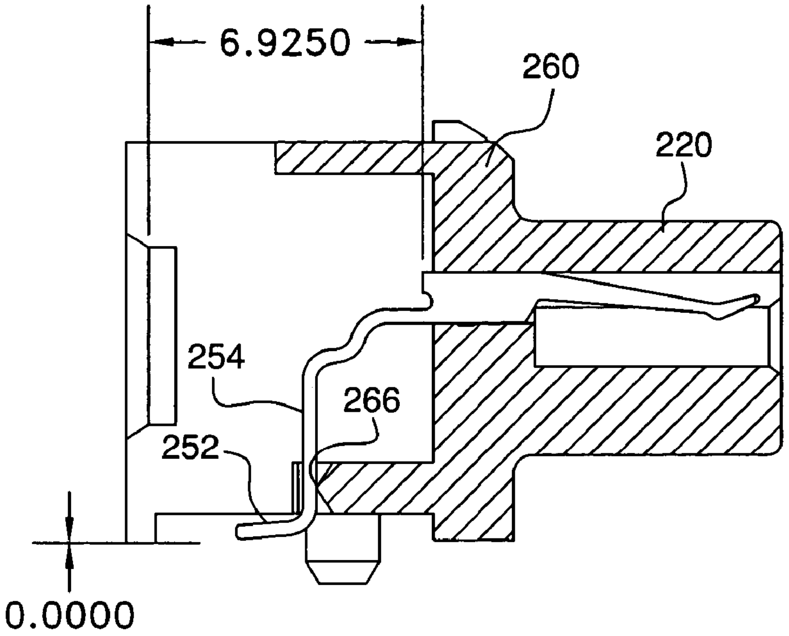
Figure 7D:
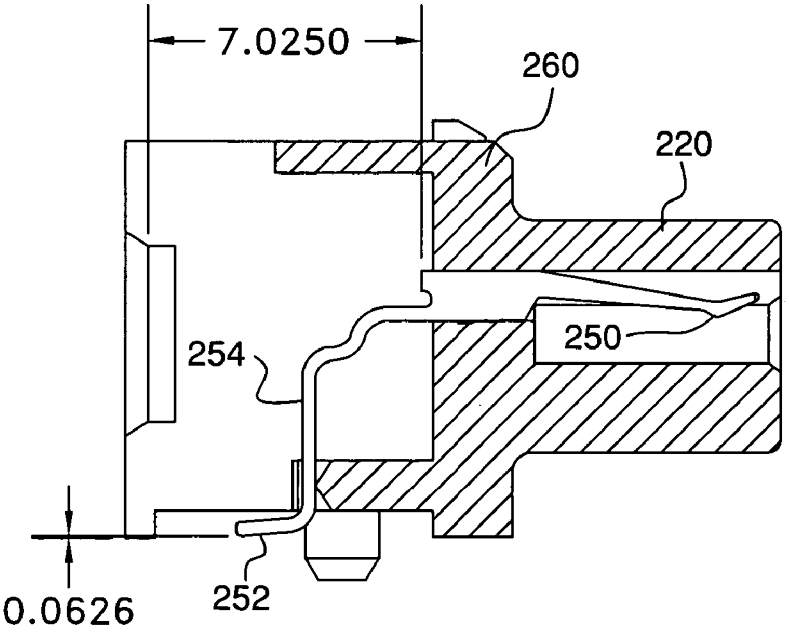
Figure 8:
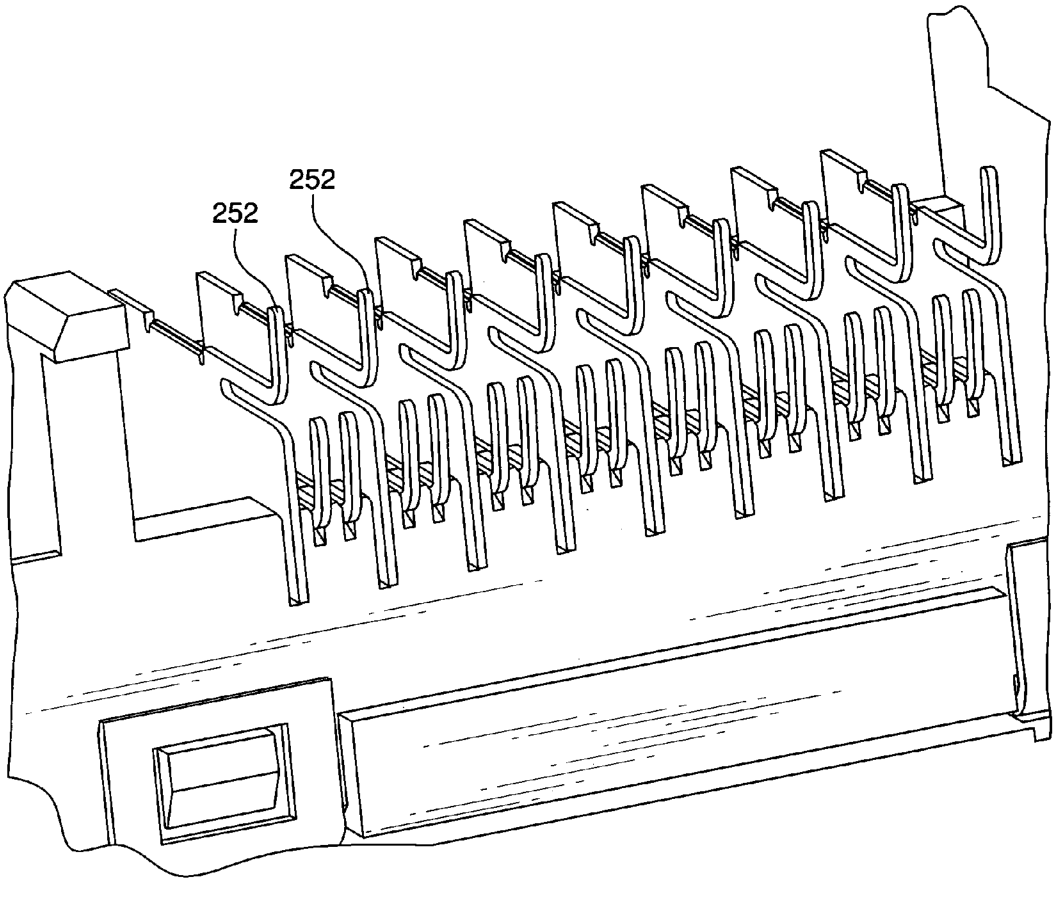
FIG. 8 is a diagram illustrating the bottom rear of an assembled exemplary receptacle.

As shown in FIG. 6, receptacle housing 210 comprises a body 260 with interface portion 220 extending therefrom. Contact support member 262 extends from body 260 and is separated from interface portion 220 by body 260. Contact support member 262 has a plurality of contact slots 264 or walled-cavities formed at the edge of member 262 for receiving a portion of contacts 212 and 214. The contact slots 264 that receive signal contacts 212, receive therein pivot member 254 of signal contacts 212. FIGS. 7A through 7D provide a sectional view of housing 210 with a signal contact 212 at various stages of insertion into housing 210. As shown, within slot 264, support alignment member 262 has formed therein a fulcrum or pivot point 266. At pivot point 266 support alignment member 262 forms a generally acute angle. When signal contact 212 is fully inserted into housing 210, pivot member 254 abuts pivot point 266, which may cause tail portion 252 to be urged upward. Thus, pivot point 266 operates to define the horizontal as well as vertical positioning of tail portion 252. Pivot points 266 are formed in a plurality of slots 264 that receive signal contacts 212. As shown in FIG. 8, upon insertion of a plurality of signal contacts 212 into housing 210, tail portions 252 are urged into horizontal and vertical alignment.

Figure 9:
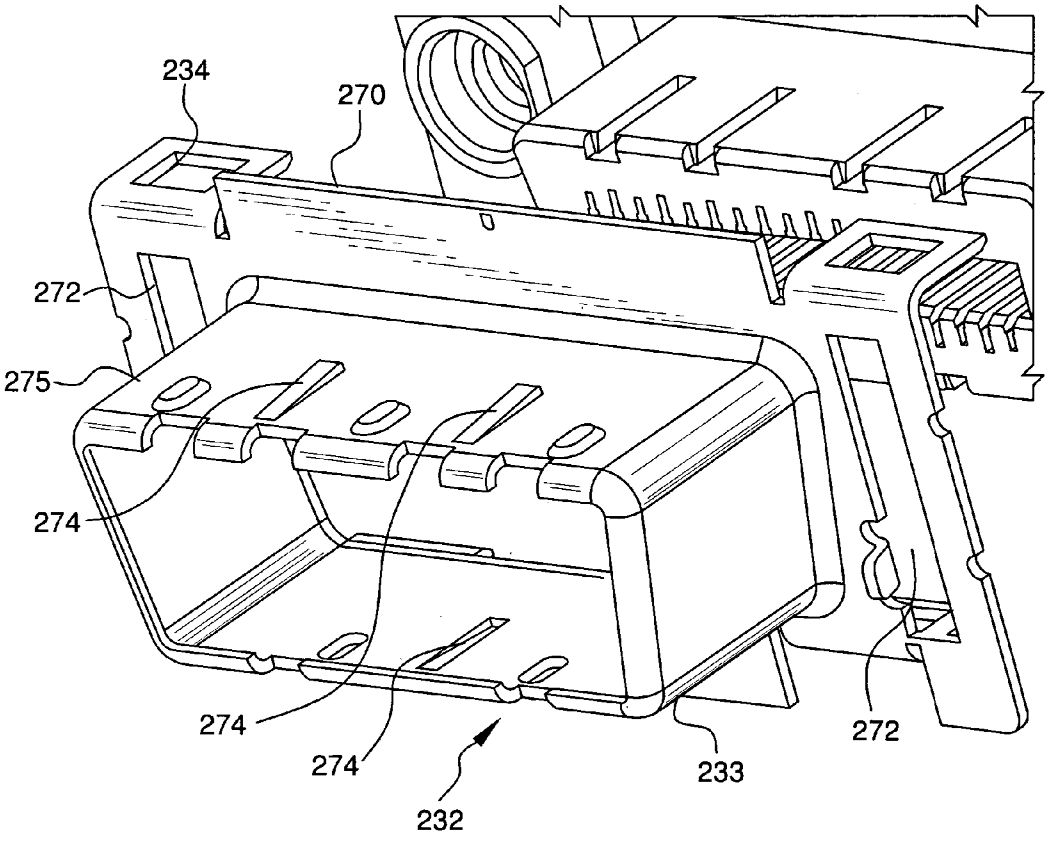
FIG. 9 is a detailed illustration of an exemplary shielding shell.

FIG. 9 provides a detailed view of shielding shell 232. As shown, shielding shell 232 comprises casing 233, which is specially formed to fit to the exterior of interface portion 220 of housing 210. Shell 232 further comprises upstanding walls 270 that are integrally formed with casing 233 and which abut exterior side 226 of housing 210 upon assembly. Shell 232 has recesses 272 formed therein to accommodate latch members 224.

Shielding shell 232 shields contacts 212 and 214 from EMI and prevents EMF leakage when receptacle 112 receives plug 110. These functions are best served when there is electrical continuity between receptacle 112 and plug 110. Accordingly, it is desirable to maintain a consistent and strong electrical contact between shielding shell 232 and the casing of plug 110. Casing 233 has outwardly projections 274 formed therein to facilitate this consistent electrical contact. In the disclosed embodiment, projections 274 have the form of cantilever beams. The height of projections 274 from the exterior surface of casing 233 increases along the length of projections 274. Increasing the height across the length of the projections 274 maintains physical contact and electrical continuity between shell 232 and the casing of plug 110 through tolerance extremes and mating conditions. As shown, projections 274 are formed on opposing sides of casing 233.

Figure 10:
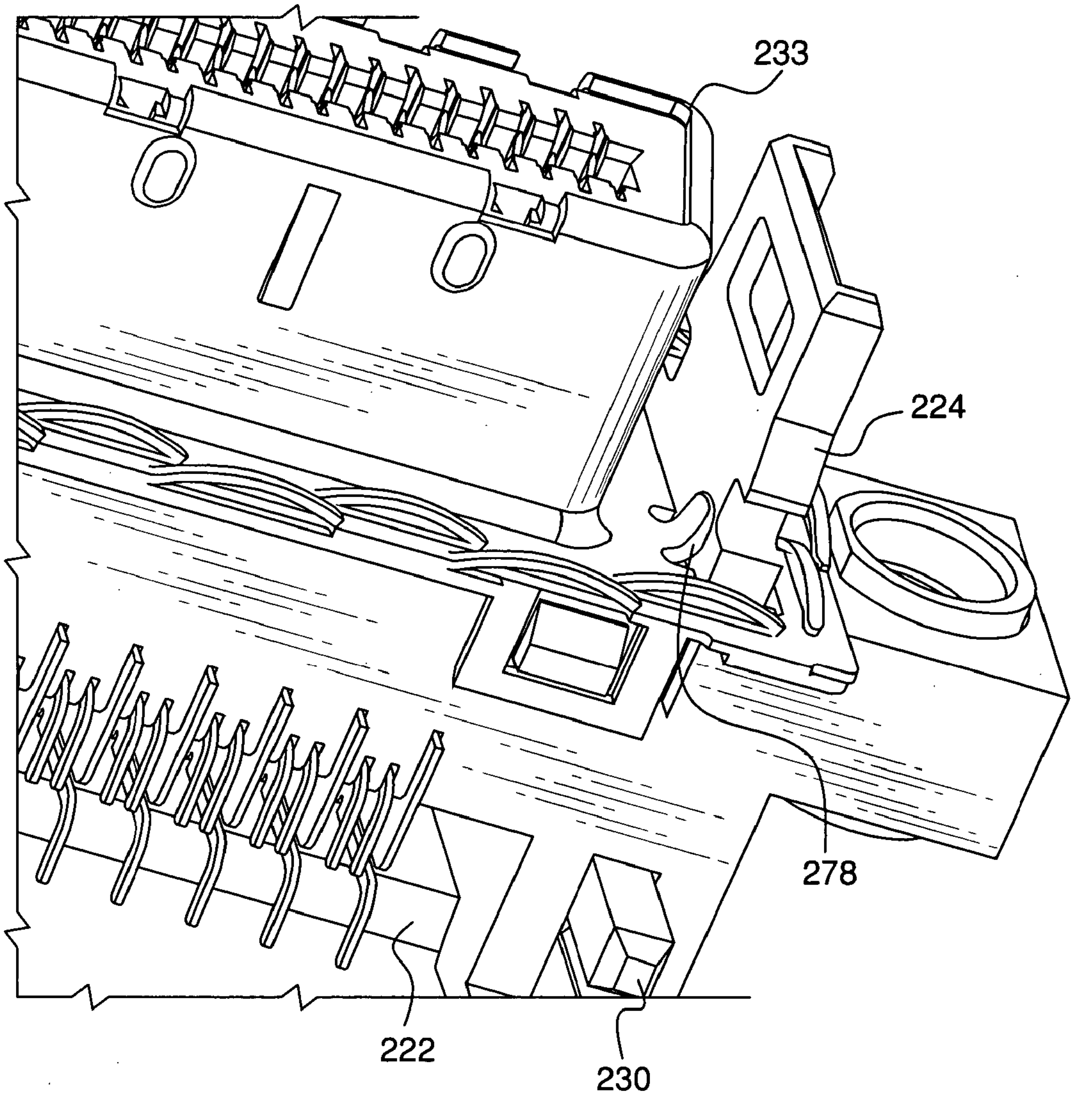
FIG. 10 is a front perspective view of an exemplary shielding shell contacting a latch member.

Shielding shell 232 further comprises projection 278. As shown in FIG. 10, upon assembly of receptacle 112, projection 278 contacts latch member 224. As noted above, latch member 224 is comprised in latch plate 216, which further comprises grounding projections 230. Accordingly, contact between projection 178 and latch member 224 provides an electrical path to ground through grounding projections 230. Indeed, electrical connectivity is provided from the casing of plug 110, through shell 232 and latch plate 216, to ground. This continuous electrical contact with the casing of plug 110, through receptacle 112 to ground maintains essentially the same ground potential between plug 110 and receptacle 112, which greatly improves performance.

Figure 11:
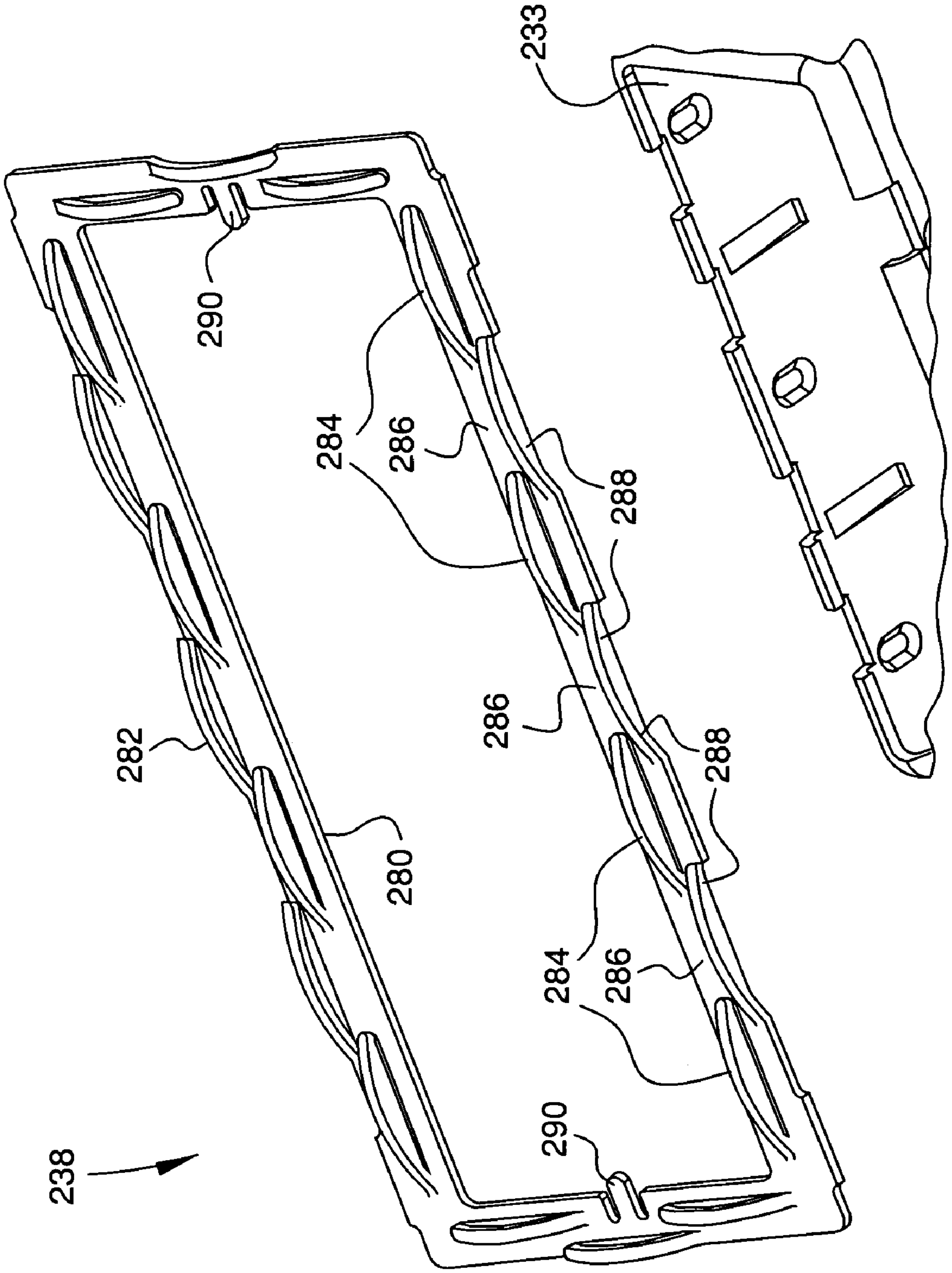
FIG. 11 is a perspective view of an exemplary electrical shielding gasket.
Figure 12:
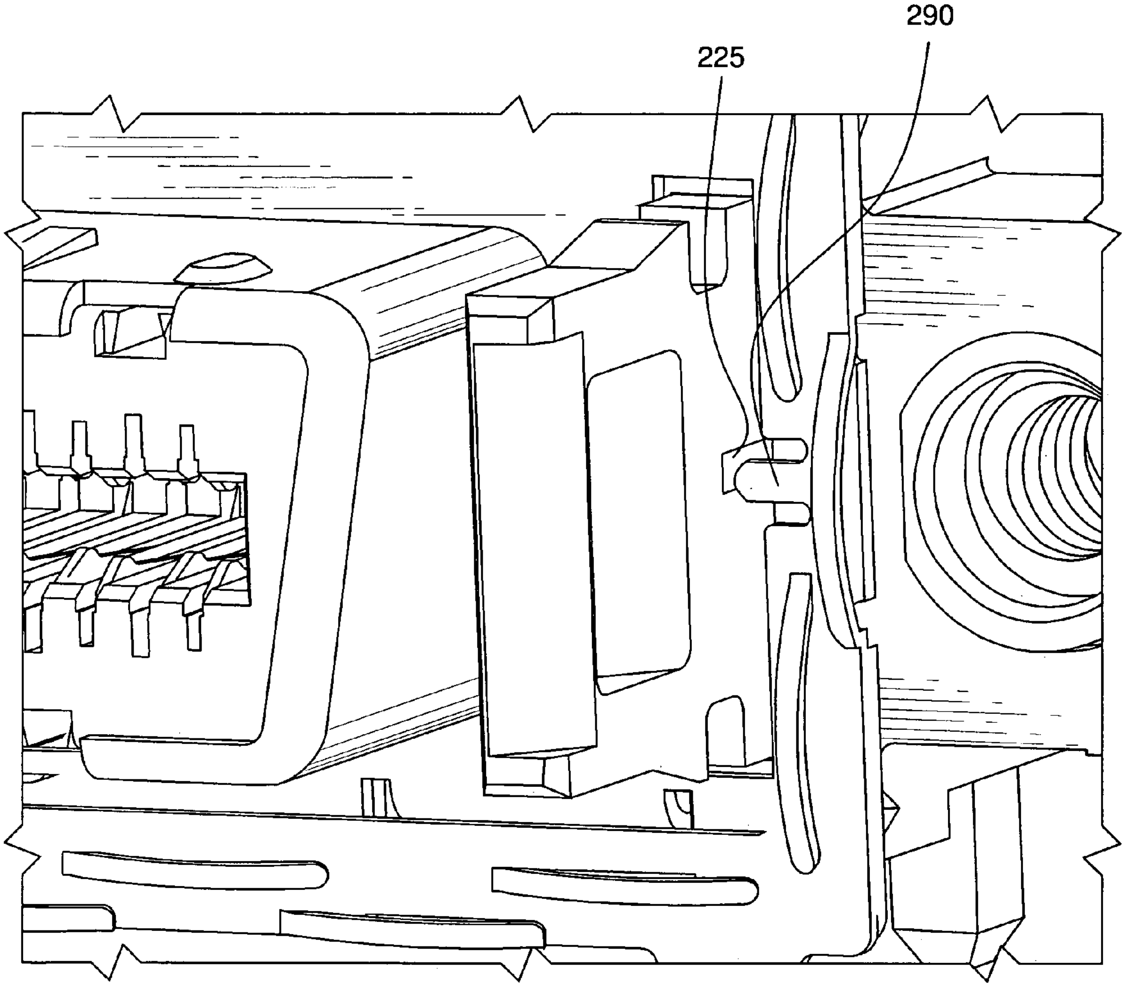
FIG. 12 is a front detailed view of an assembled exemplary receptacle illustrating the interaction of an electrical shielding gasket and a recess in a latch member.

A detailed view of electrical gasket 238 is provided in FIGS. 11 and 12. As shown, gasket 238 comprises frame 280, which is formed to be positioned around casing 233 of shell 232. Frame 280 has a plurality of arcuate metallic beams 282 extending therefrom around the perimeter of frame 280. Beams 282 extend from frame 280 in a generally arc-like shape and return to frame 280. Beams 282 may be formed, for example, by stamping of the gasket frame 280. A first plurality 284 of beams 282 is aligned linearly along frame 280 with portions 286 of frame 280 disposed in-between. A second plurality 288 of beams 282 is formed next to the first plurality 284. Beams 282 in the second plurality 288 overlap beams 282 in the first plurality 284 and thereby span portions 286 between beams in the first plurality 284. When gasket 238 is applied to receptacle 112 and plug 110 connected thereto, is positioned proximate any gap between plug 110 and receptacle 112 and overlapping beams 282 minimize the escape paths for electromagnetic forces (EMF's) between the two devices.

Gasket 238 further comprises locking members 290 for restricting movement of gasket 238 on the assembled receptacle 112. Locking member 290 extends away from frame 280 and, when assembled onto receptacle 112, into channels 225 formed in latch members 224. Locking member 290 resides in channel 225 and is limited in its freedom of movement by the length of channel 225.

Figure 13:
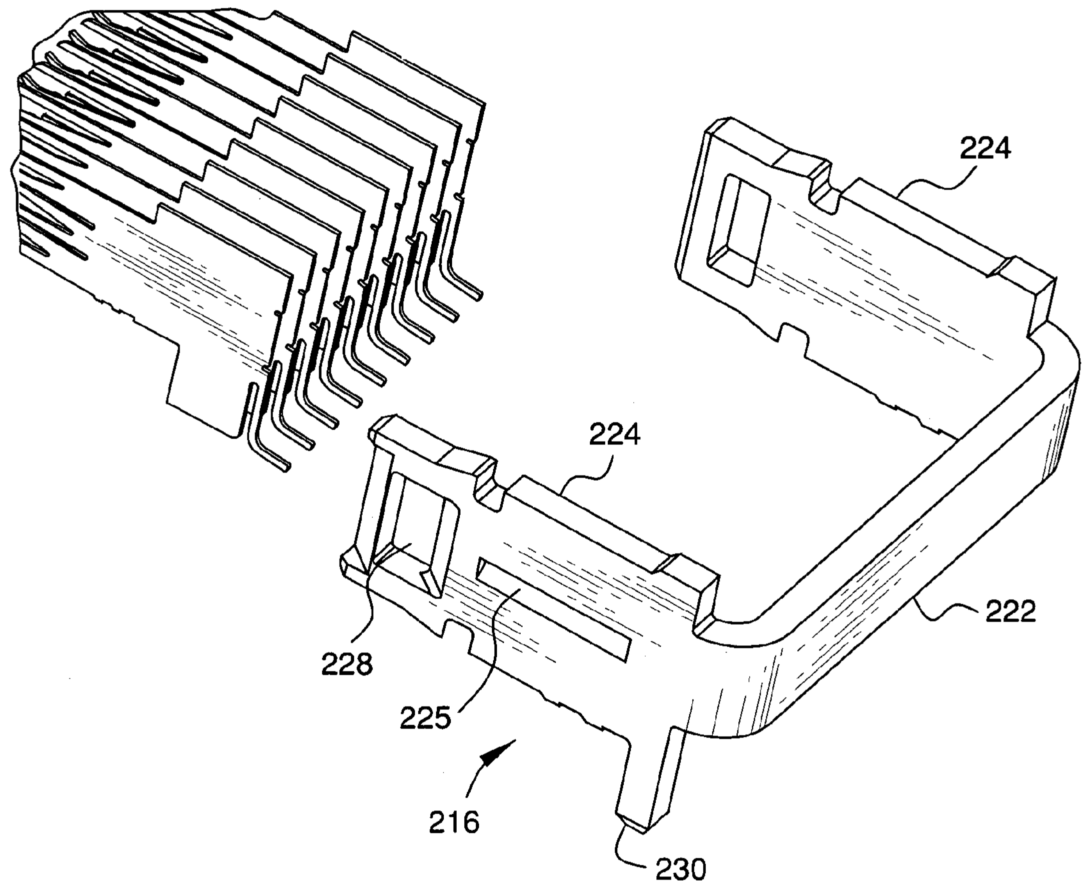
FIG. 13 is an isolated view of an exemplary latch plate.
Figure 14:
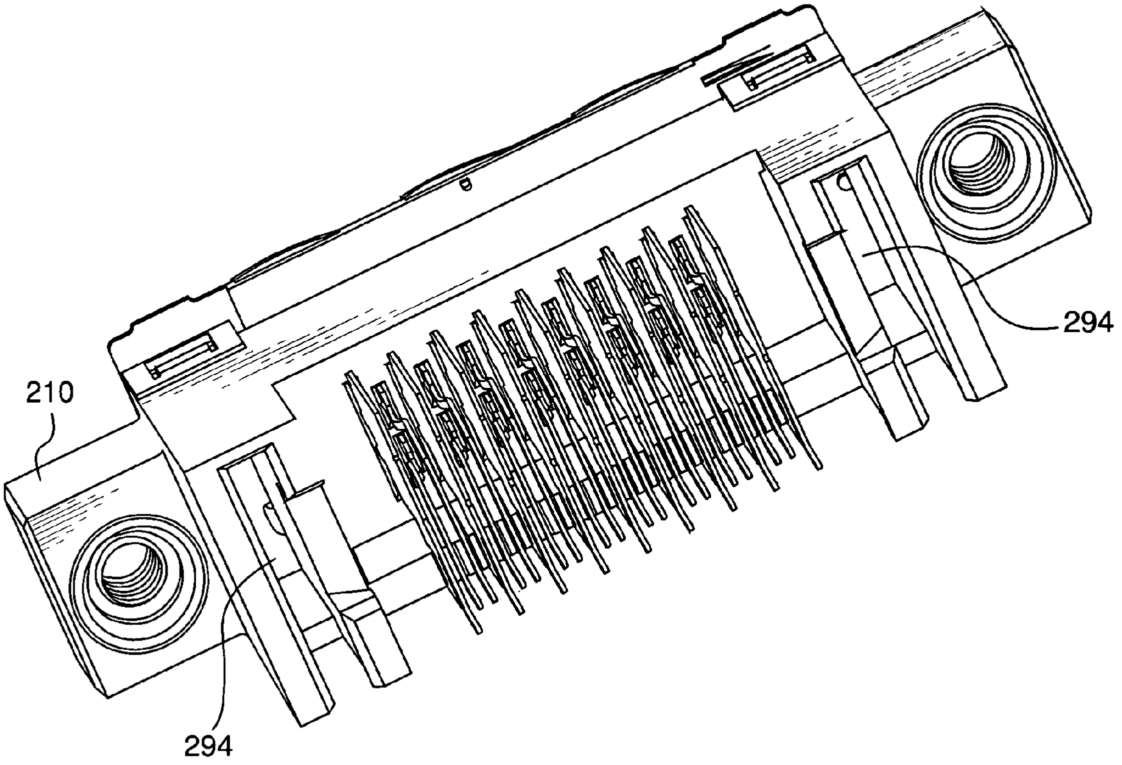
FIG. 14 is a rear view of an exemplary receptacle housing without a latch plate attached thereto.

FIG. 13 provides a detailed view of latch plate 216. As shown, latch plate 216 comprises latch bar 222 with latch members 224 extending therefrom. Latch members 224 may be inserted into latch member openings 294 formed in housing 210 (see FIG. 14) and extend from external side 226 of housing 210. Recesses 228 formed in latch members 224 receive corresponding latch members from plug 110 and operate to secure the two device halves together. Latch bar 222 operates to provide protection to contacts 212 and 214 and counterbalances the weight of housing 210 when the components assembled into receptacle 112. Latch plate 216 has grounding projections 230 formed therein which are designed to contact a ground source on the device to which receptacle 112 is attached. For example, grounding projections 232 may contact a ground located on a printed circuit board. Finally, channels 225 are formed in the exterior walls of latch members 224 and receive locking members 290.

Plug

Figure 15:
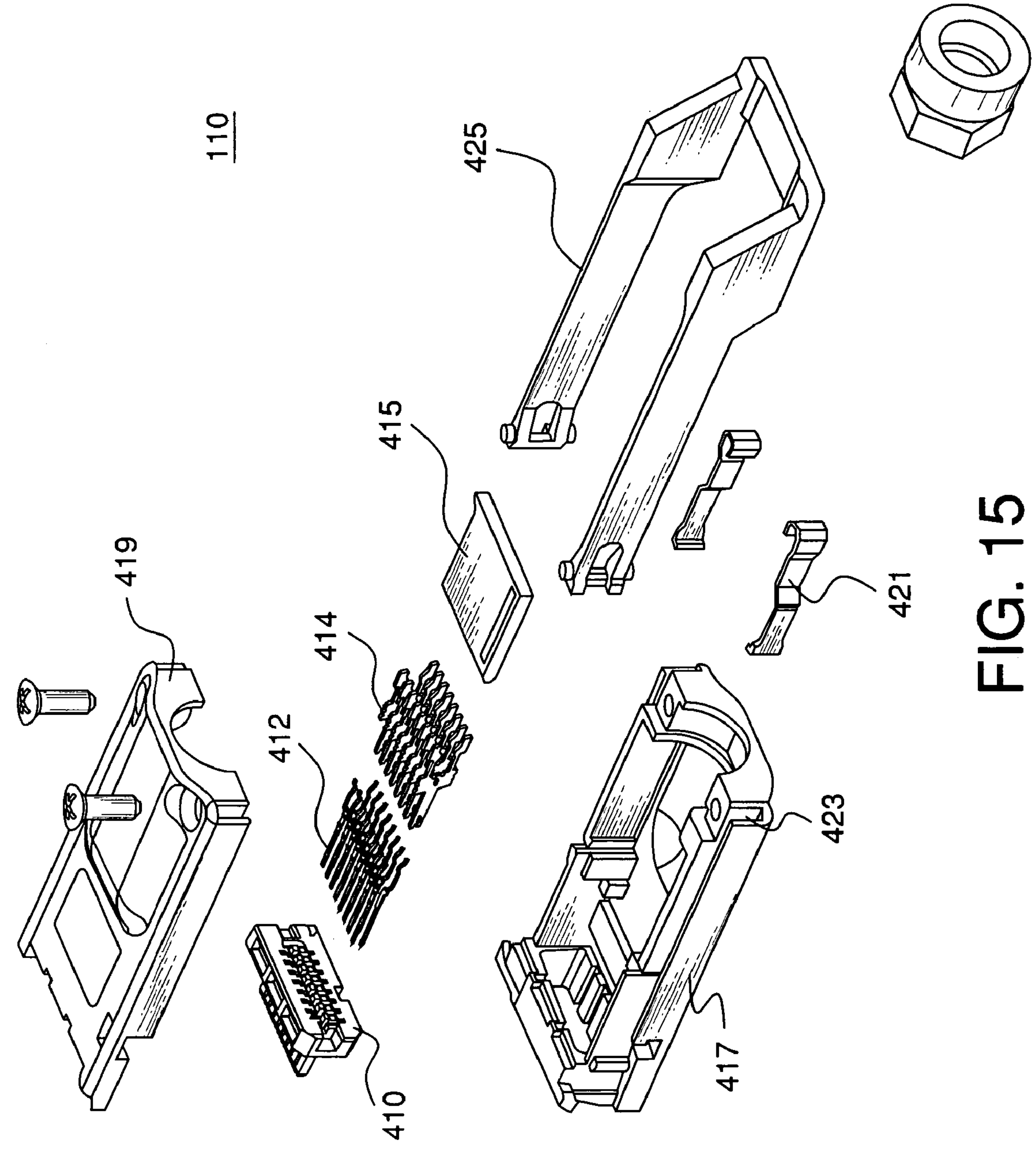
FIG. 15 is a perspective view of an exploded exemplary plug.

FIG. 15 provides an exploded view of plug 110. As shown, plug 110 comprises plug housing 410 into which signal contacts 412 and ground contacts 414 are inserted. Contacts 412 and 414 interface with printed circuit board 415 which has signal wires attached thereto (not shown) and which extend from plug 110 in a cable (not shown). Plug housing 410 with contacts 412 and 414 therein and circuit board 415 attached thereto are encapsulated in lower casing half 417 and upper casing half 419. Latches 421 reside in recesses 423 in casing halves 417 and 419 and interlock with latch members 224 of plug 112. Lanyard 425 is connected to latches 421 and is operable to control the latching position of latches 421.

Figure 16:
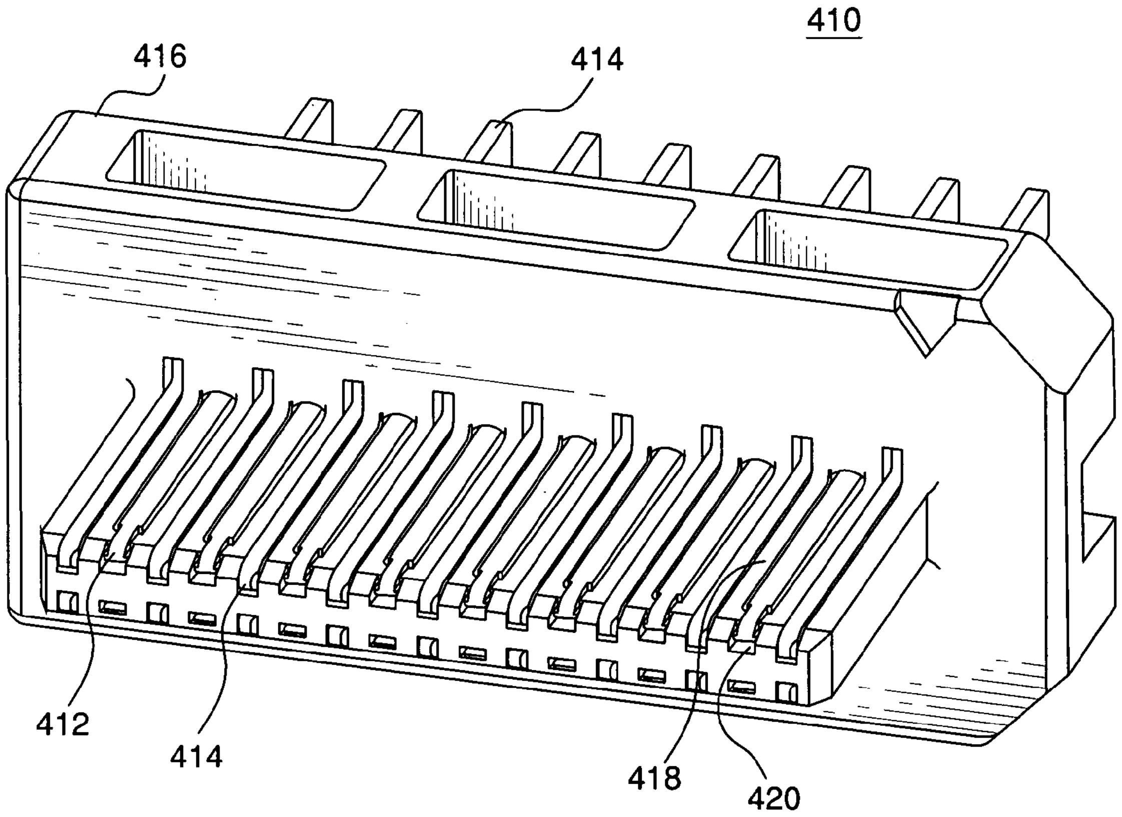
FIG. 16 is a front perspective view of an exemplary plug housing with contacts therein.
Figure 17A:
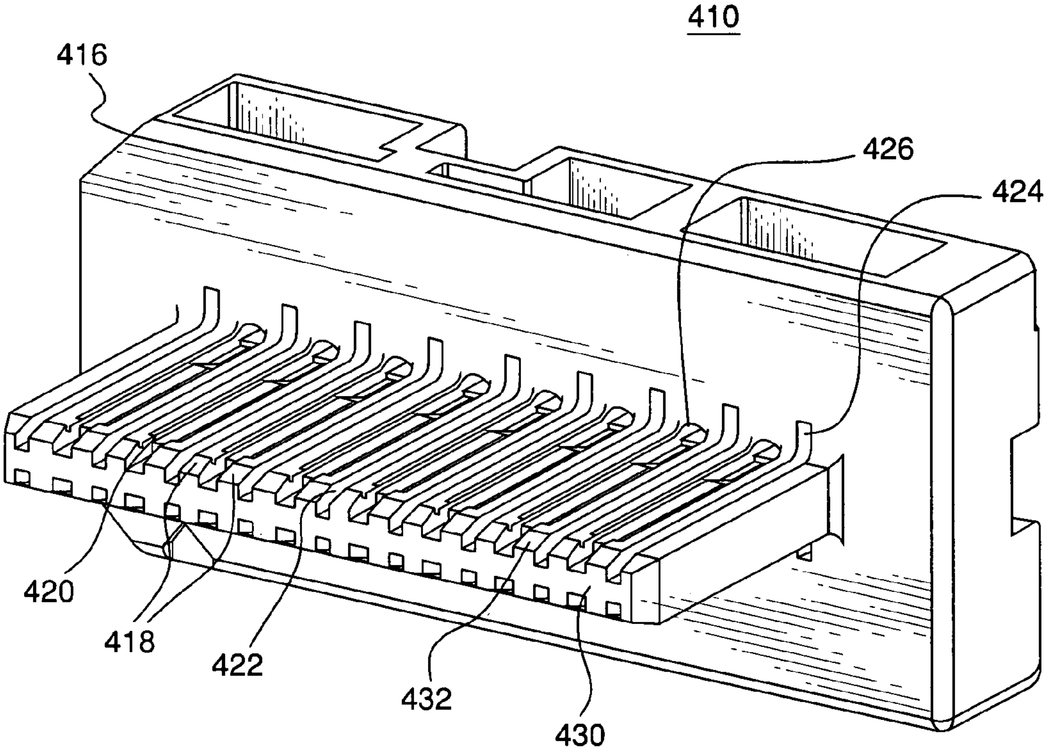
FIG. 17A is a front perspective view of an exemplary plug housing with contacts removed.
Figure 17B:
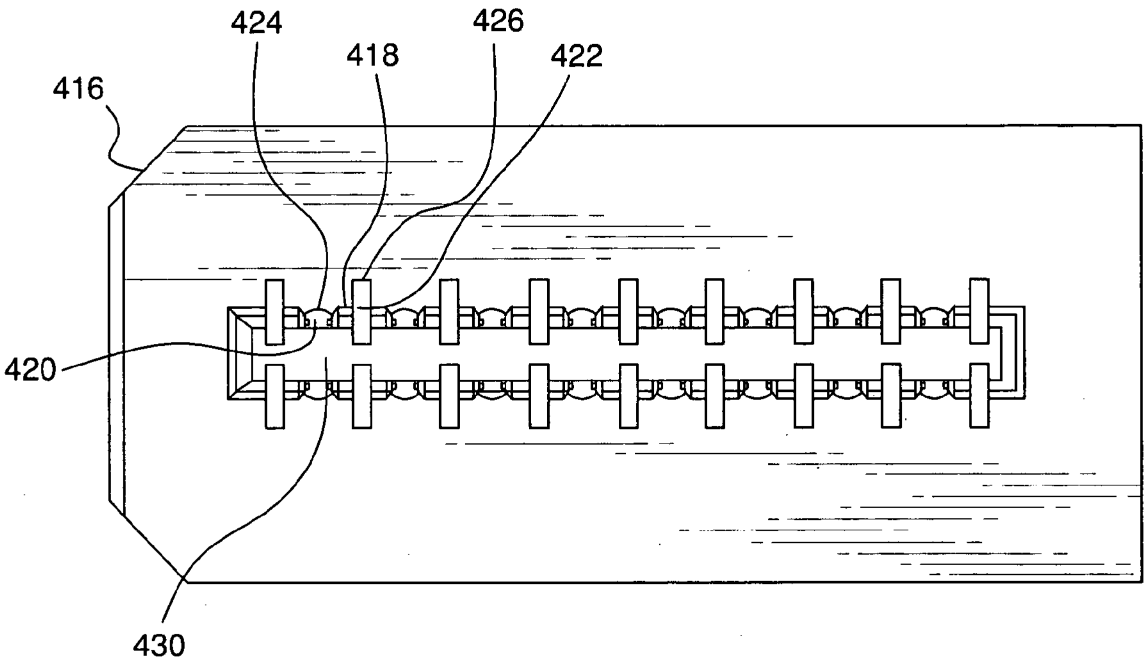
FIG. 17B is a front view of the exemplary housing with contacts removed.

FIG. 16 provides an isolated view of plug housing 410 with signal contacts 412 and ground contacts 414 formed therein. FIG. 17A provides a perspective view, and FIG. 17B provides a front view of housing 410 without contacts 412 and 414. As shown, housing 410 comprises a body portion 416 which has a plurality of projections or beams 418 extending therefrom. Beams 418 have troughs 420 formed therein with gaps 422 formed between beams 418. Body 416 has a plurality of conduits 424 formed therein aligning with troughs 420. Signal contacts 412 extend through conduits and in troughs 420. Body also has a second plurality of conduits 426 formed therein that align with gaps 422 formed between beams 422. Ground contacts 414 extend through conduits 426 and into gaps 422. Housing 410 further comprises nose member 430 that bridges the gaps between beams 418 near their distal ends 432.

Figure 18:
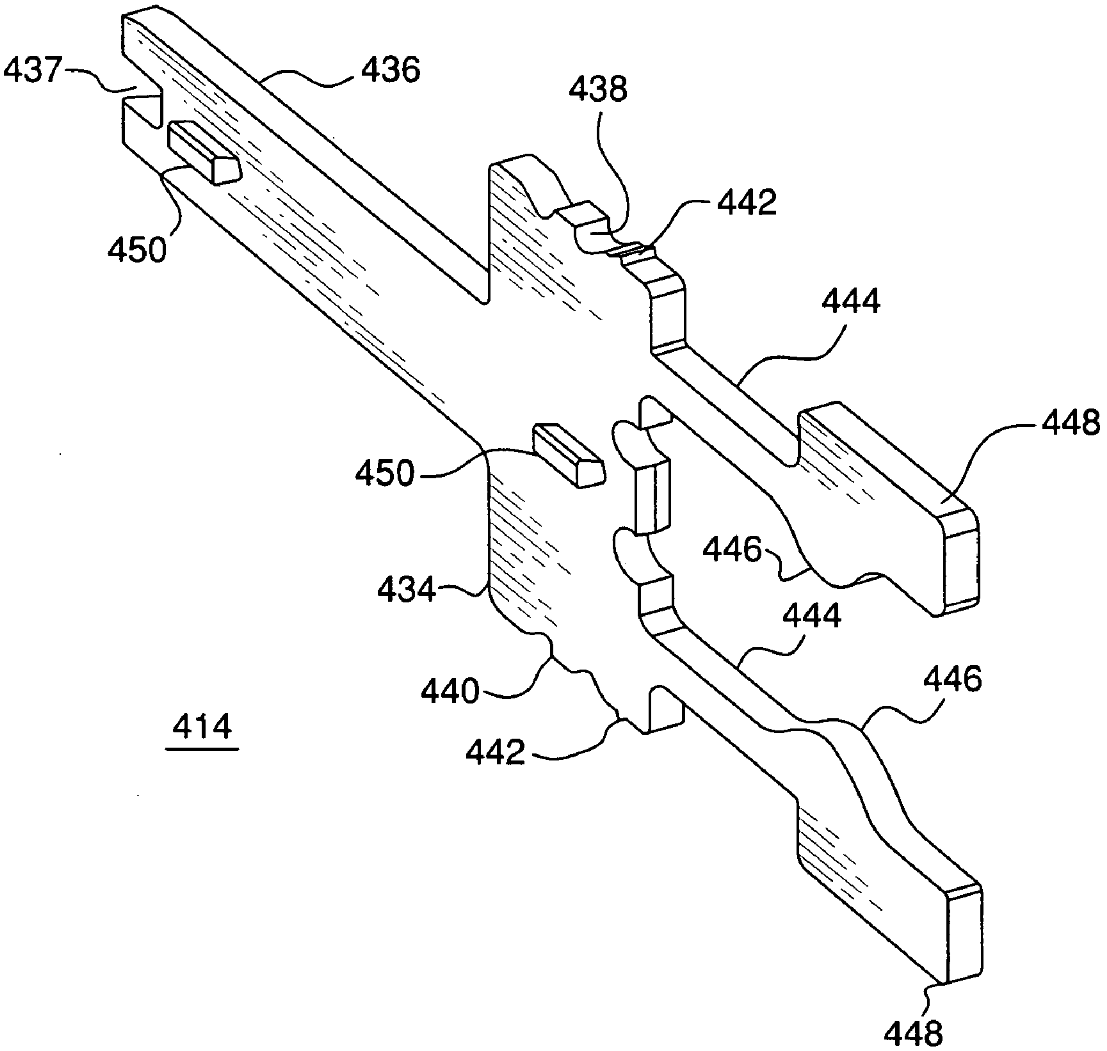
FIG. 18 is an isolated view of an exemplary ground contact for use in an exemplary plug housing.

FIG. 18 provides an isolated view of grounding contact 414. As shown, grounding contact comprises body 434 with an elongated contact area 436 extending therefrom. Elongated contact area 436 has notch or recess 437 formed therein for securing the distal end as described below. Grounding contact body 434 has a first surface 438 and a second surface 440 fitted with barbs 442 to enhance interference fit with housing 410. Ground contact 414 further comprises armatures 444 that extend from body 434 and are separated from contact area 436 by body 434. Armatures 444 have contact areas 446 formed therein for forming an electrical contact with printed circuit board 415. Armatures 444 further have formed therein tool application area 448. In the disclosed embodiment, tool application areas 448 comprise two surfaces formed at right angles and are suitable for application of a tool for inserting contact 414 into housing 410. A portion of tool application areas 448 substantially align with surfaces 438 and 440 and provide a suitable leverage point for applying pressure, with for example, a tool, to insert contact 414 into housing 410. Contact 414 further comprises projections 450 extending from the sides of elongated contact area 436 and body 434. As described in detail below, in the assembled plug housing 410, projections 450 reside in channels formed in the plug housing body 416 and beams 418.

Figure 19:
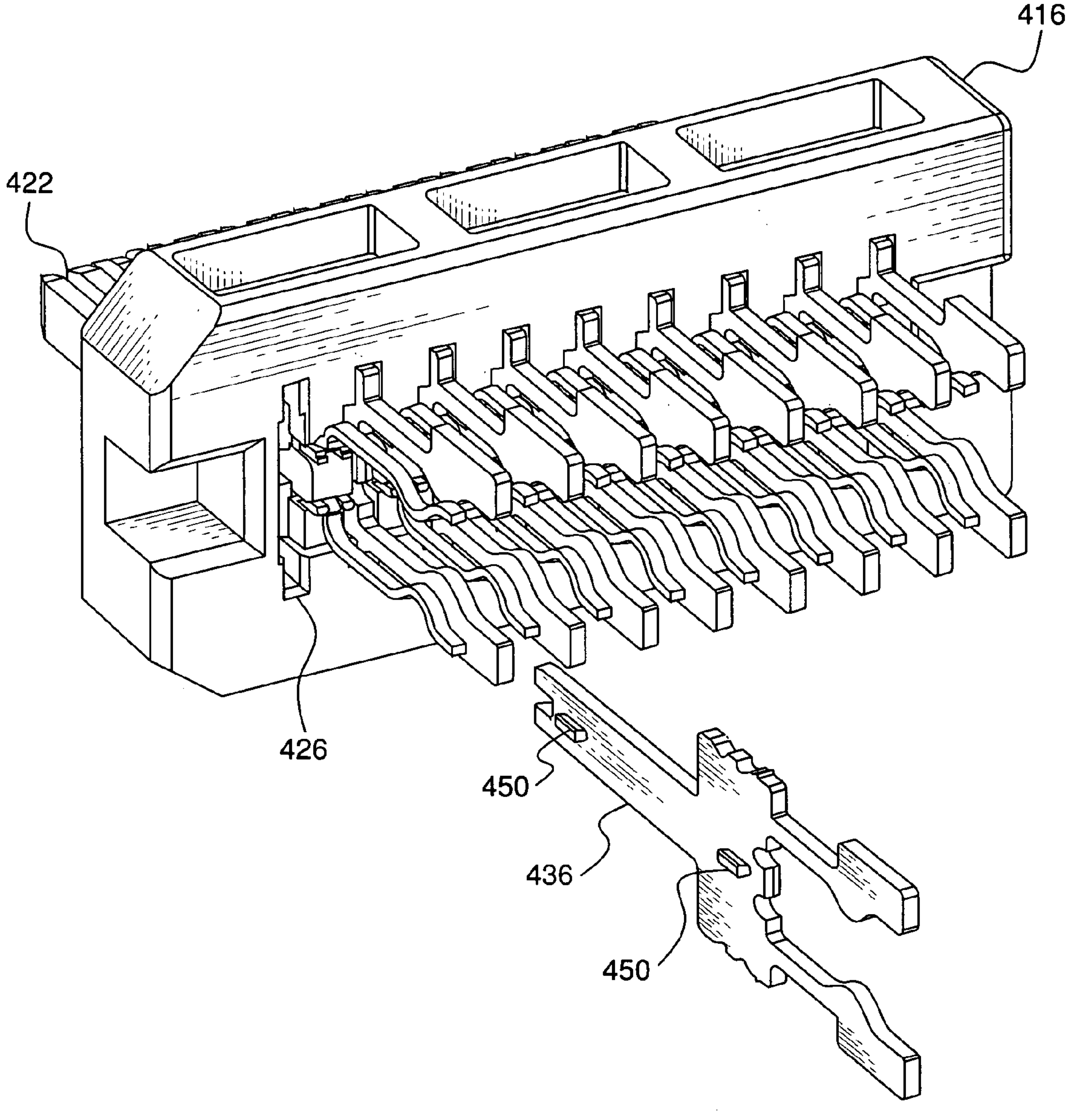
FIG. 19 is a perspective rear view of an exemplary plug housing with an exemplary ground contact aligned for insertion.
Figure 20:
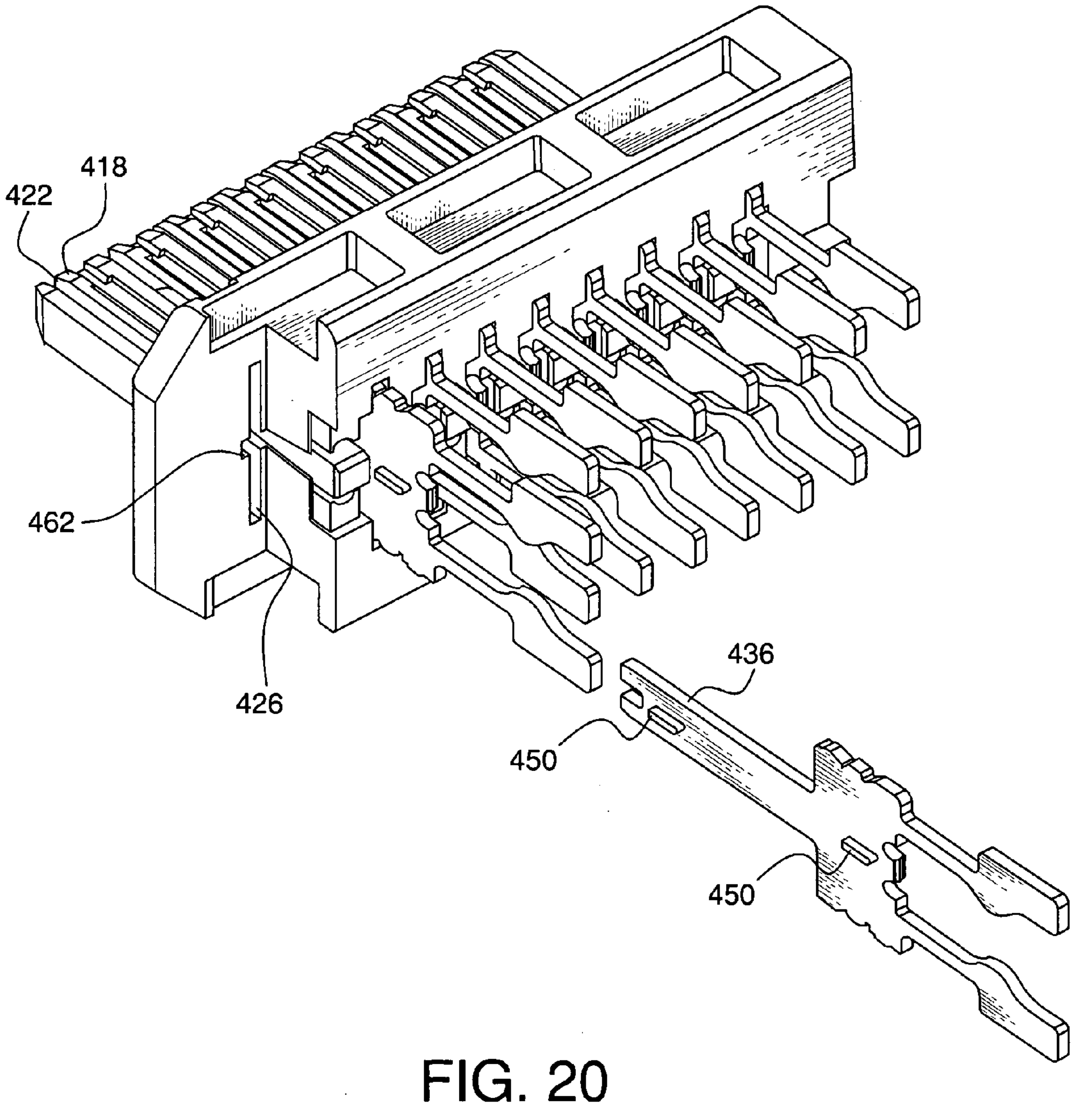
FIG. 20 is a perspective rear view, partially in section, of an exemplary plug housing with an exemplary ground contact aligned for insertion.

FIG. 19 provides a view of the rear of plug housing 410. FIG. 20 provides a view of the rear of plug housing 410 partially in section. As shown, body 416 has slots or conduits 426 formed therein. Conduits 426 align with gaps 422 formed between beams 418 extending from the opposing side of body 416. Accordingly, ground contacts 414 may be inserted into conduits 426 and elongated contact section 436 extend into the gaps 422 formed between beams 418. Conduits 426 have channels 462 formed therein which extend into the eternal sides of beams 418 facing gaps 422. Channels 462 accept projections 450 extending from ground contacts 414 and thereby secure ground contacts 414 into place within plug housing 410 during insertion and afterwards.

Figure 21:
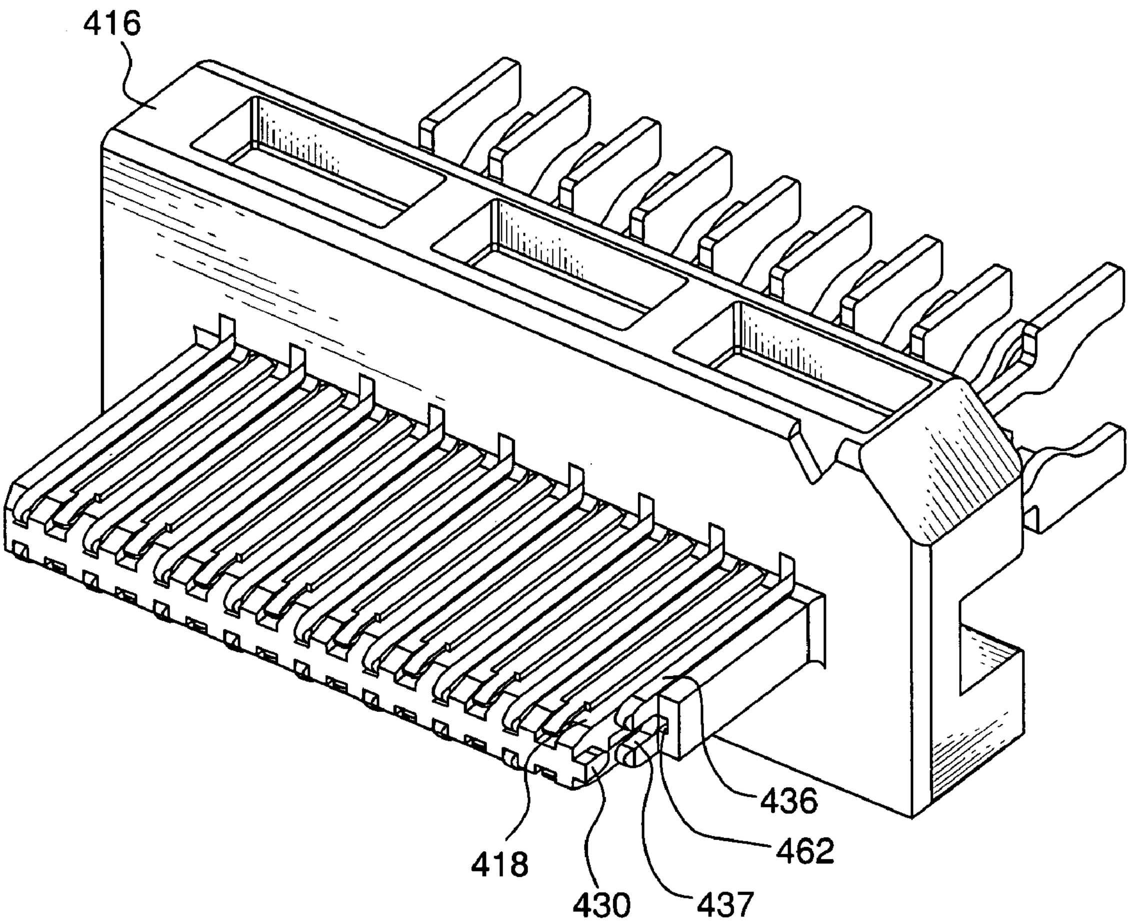
FIG. 21 is a perspective front view, partially in section, of an exemplary plug housing with an exemplary ground contact partially inserted therein.
Figure 22:
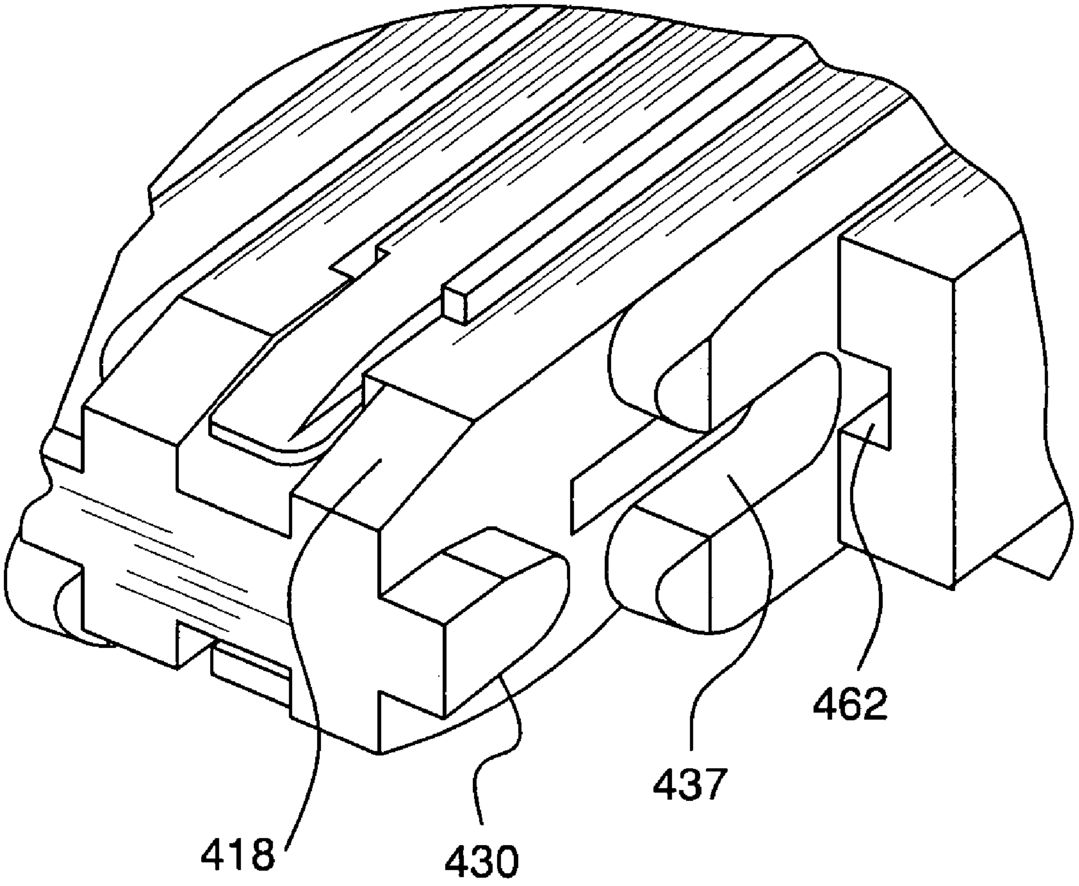
FIG. 22 is a detailed front view, partially in section, of an exemplary plug housing with an exemplary ground contact partially inserted therein.

FIGS. 21 and 22 provide a front view of plug housing 410 with a beam 418 shown partially in section. As shown, channel 462 extends along beam 418 in gap 422 between beams. Also, notch 437 in ground contact 414 has a profile corresponding to and designed to engage nose member 430. When ground contact 414 is fully inserted into plug housing 410, notch 437 engages nose member 430 thereby securing the distal end of contact 414 in place.

Figure 23:
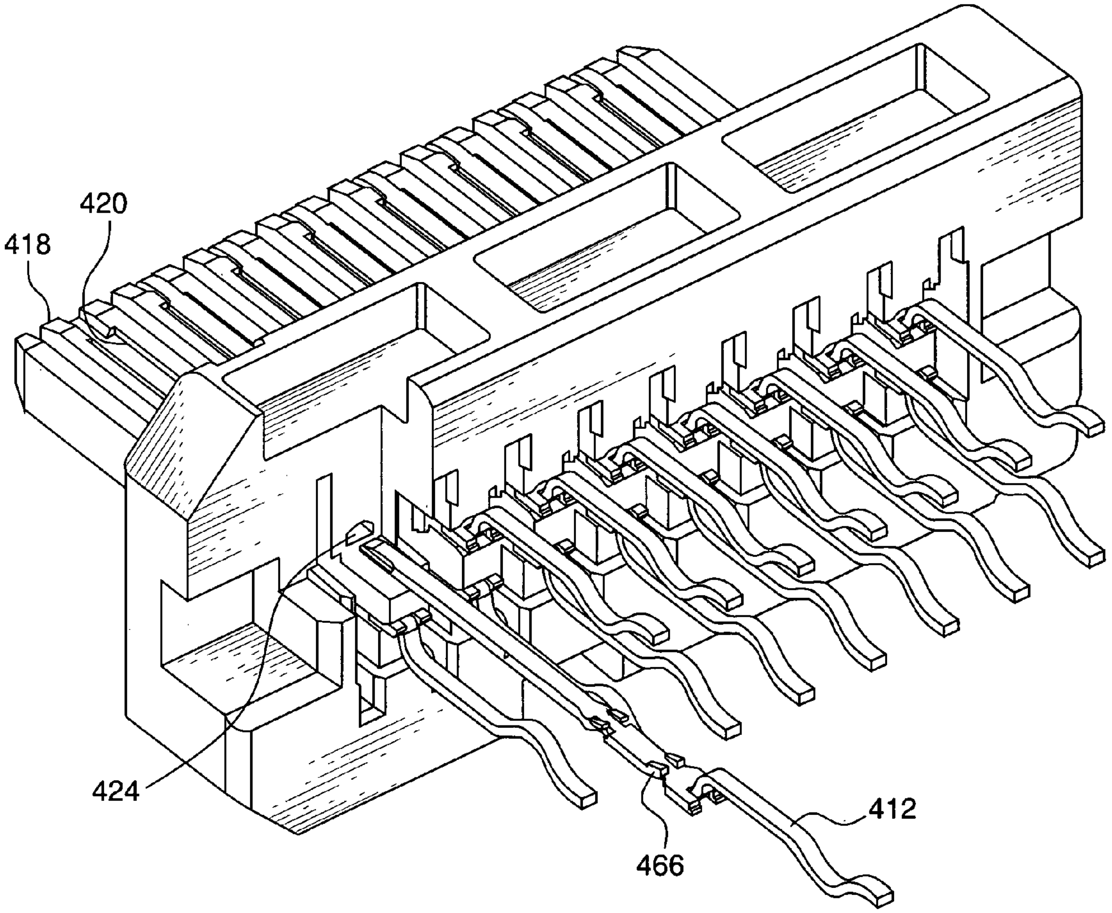
FIG. 23 is a perspective rear view, partially in section, of an exemplary plug housing with an exemplary signal contact aligned for insertion.

FIG. 23 provides a view of the rear of plug housing 410 partially in section. As shown, housing body 416 has conduits 424 formed therein for receiving signal contacts 412. Conduits 424 align with beams 418, and specifically troughs 420 formed in beams 418. Contacts 412 are inserted into conduits 424 and extend into troughs 420.

Figure 24:
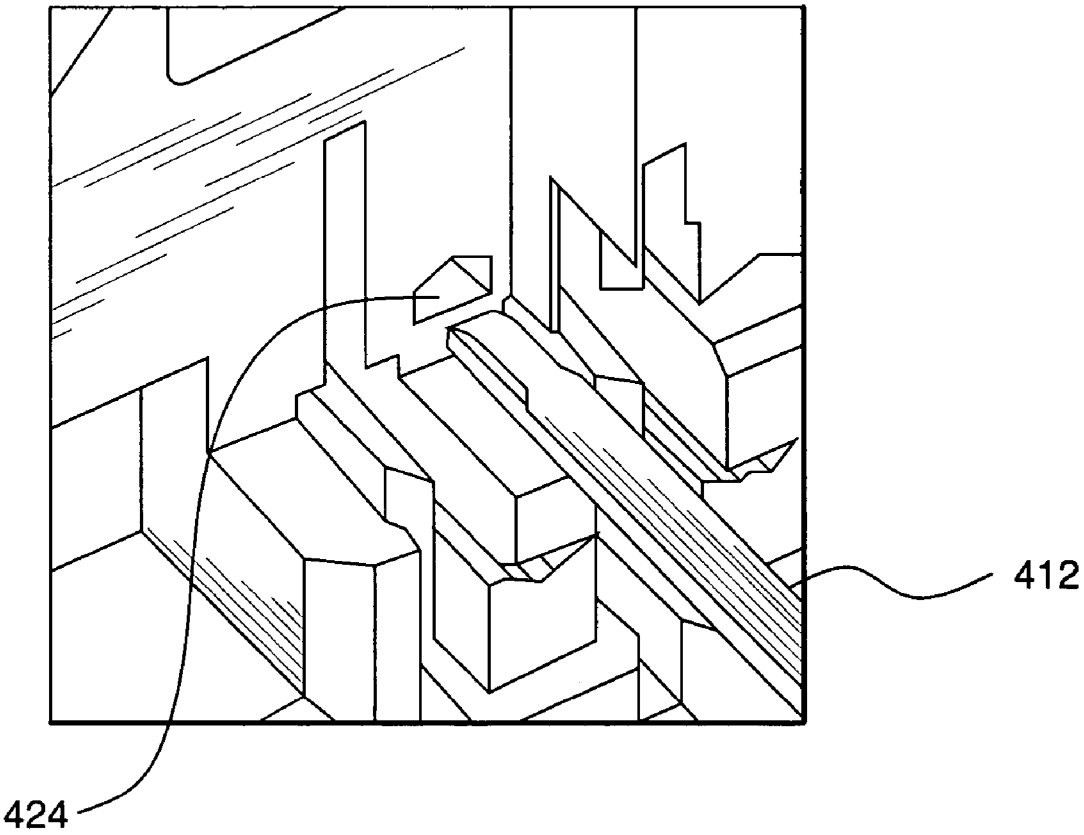
FIG. 24 is a detailed rear view, partially in section, of a signal contact aligned for insertion into an exemplary plug housing.
Figure 25:
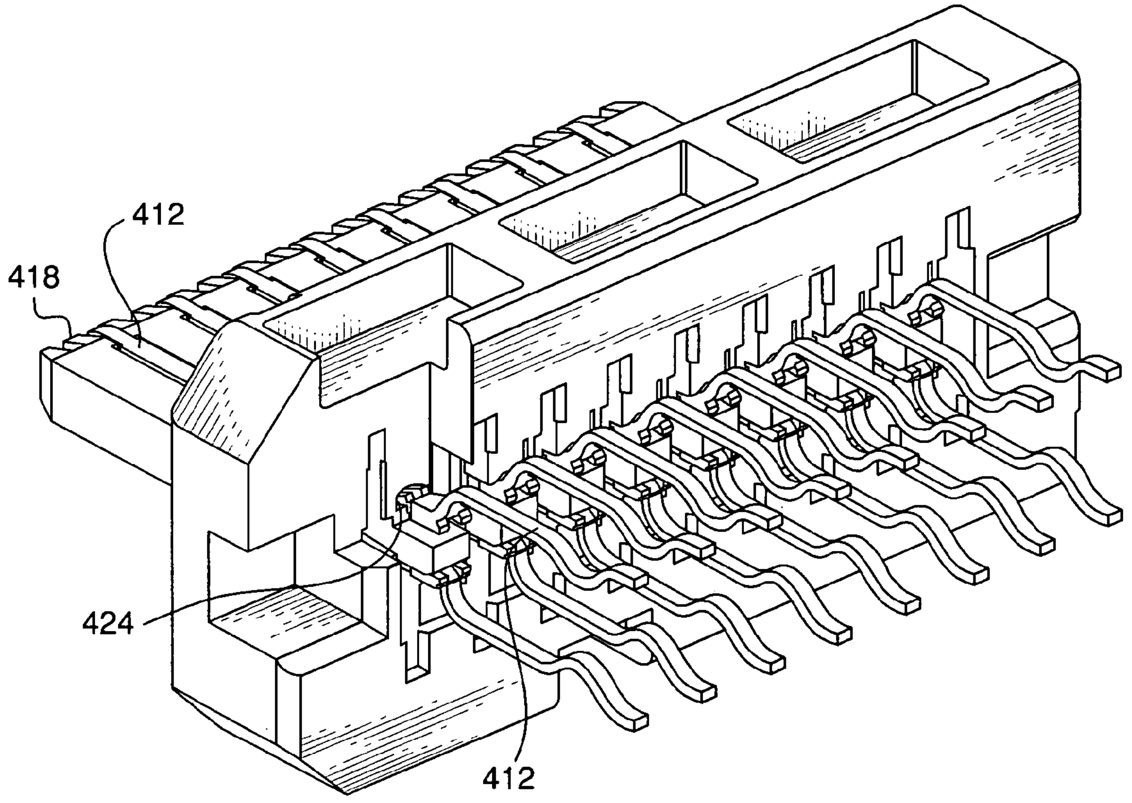
FIG. 25 is a perspective rear view, partially in section, of an exemplary plug housing with contact signals inserted therein.
Figure 26:
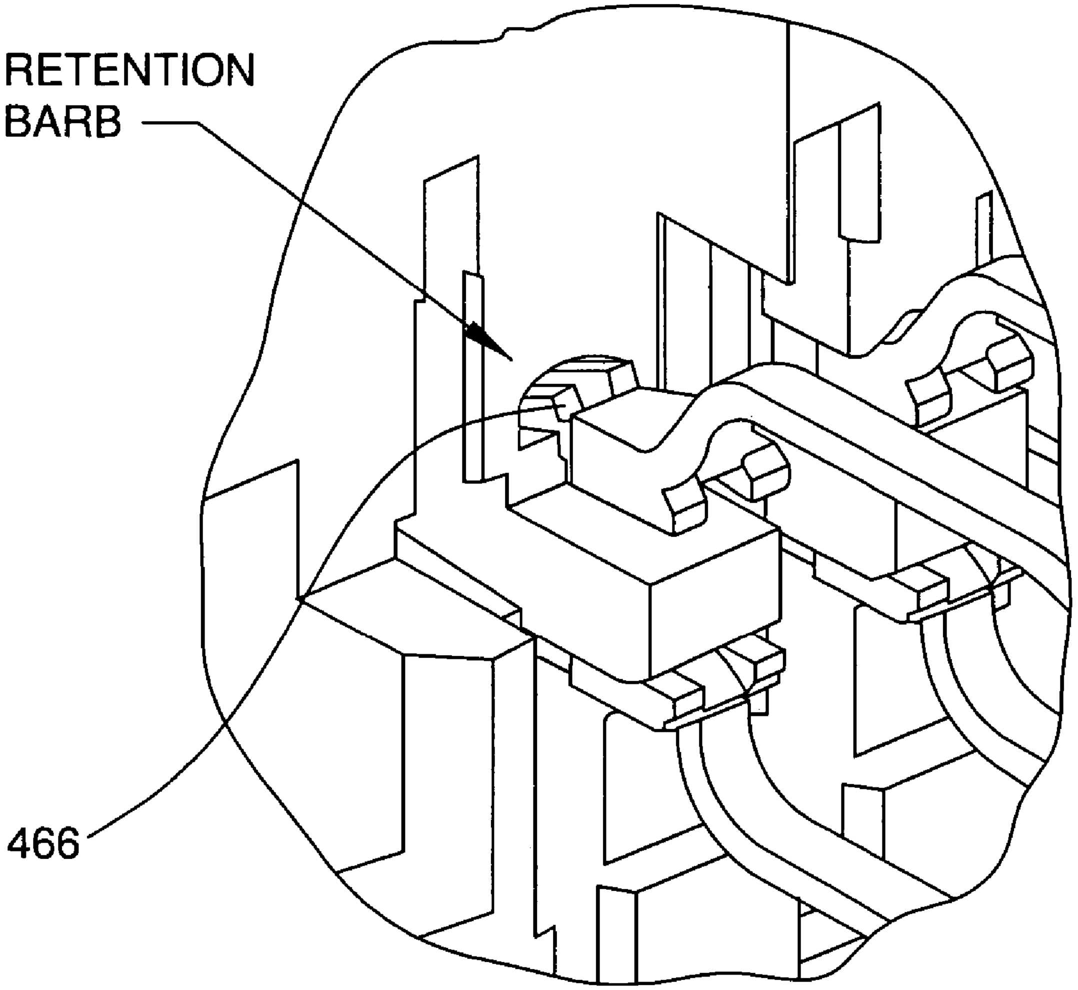
FIG. 26 is a detailed rear view, partially in section, of a signal contact fully inserted into an exemplary plug housing.

FIG. 24 provides an enlarged view of an opening for conduit 424. In the disclosed embodiment, the opening of conduit 424 has four sides, three of which are straight and a fourth which is arcuate in shape. Those skilled in the art recognize that other shapes may be used. The form factor of the opening of conduit 424 is larger than the form factor of the portion of contact 412 that is inserted into and through the opening. For example, the height of the opening of conduit 424 is greater than that of the portion of contact 414 that is inserted therein. This difference in height prevents conduit 424 from frictionally disturbing the contact portion of signal contact 412. As shown in FIGS. 25 and 26, however, a portion of signal contact 412, referred to herein as a retention barb 466, has a form factor greater than the opening to conduit 424. Accordingly, barb section 466 and contact 412 are secured frictionally in plug housing 410.

Figure 27:
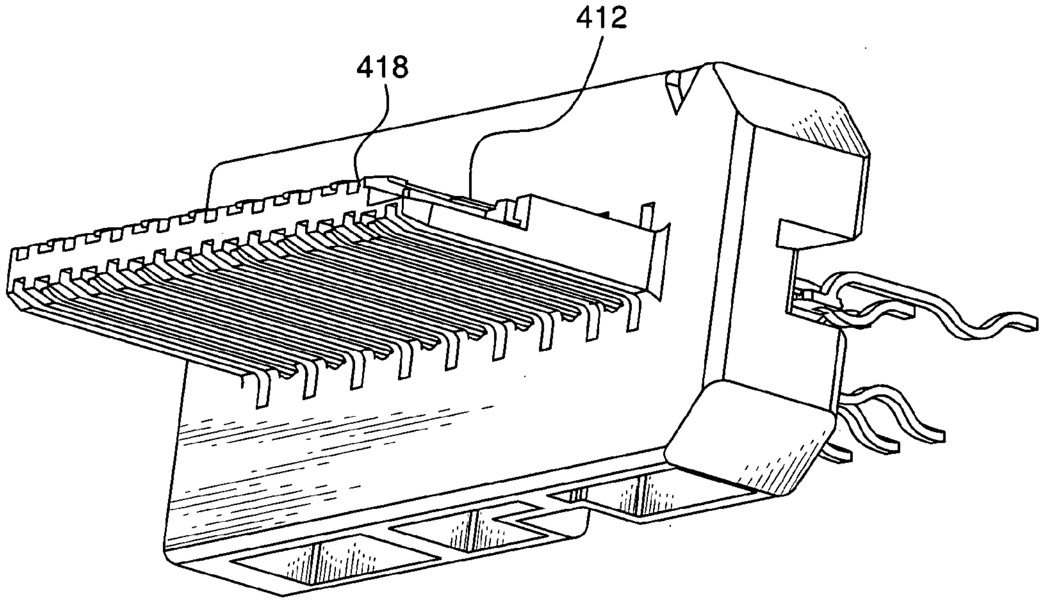
FIG. 27 is a front perspective view, partially in section, of a signal contact partially inserted into an exemplary plug housing.
Figure 28:
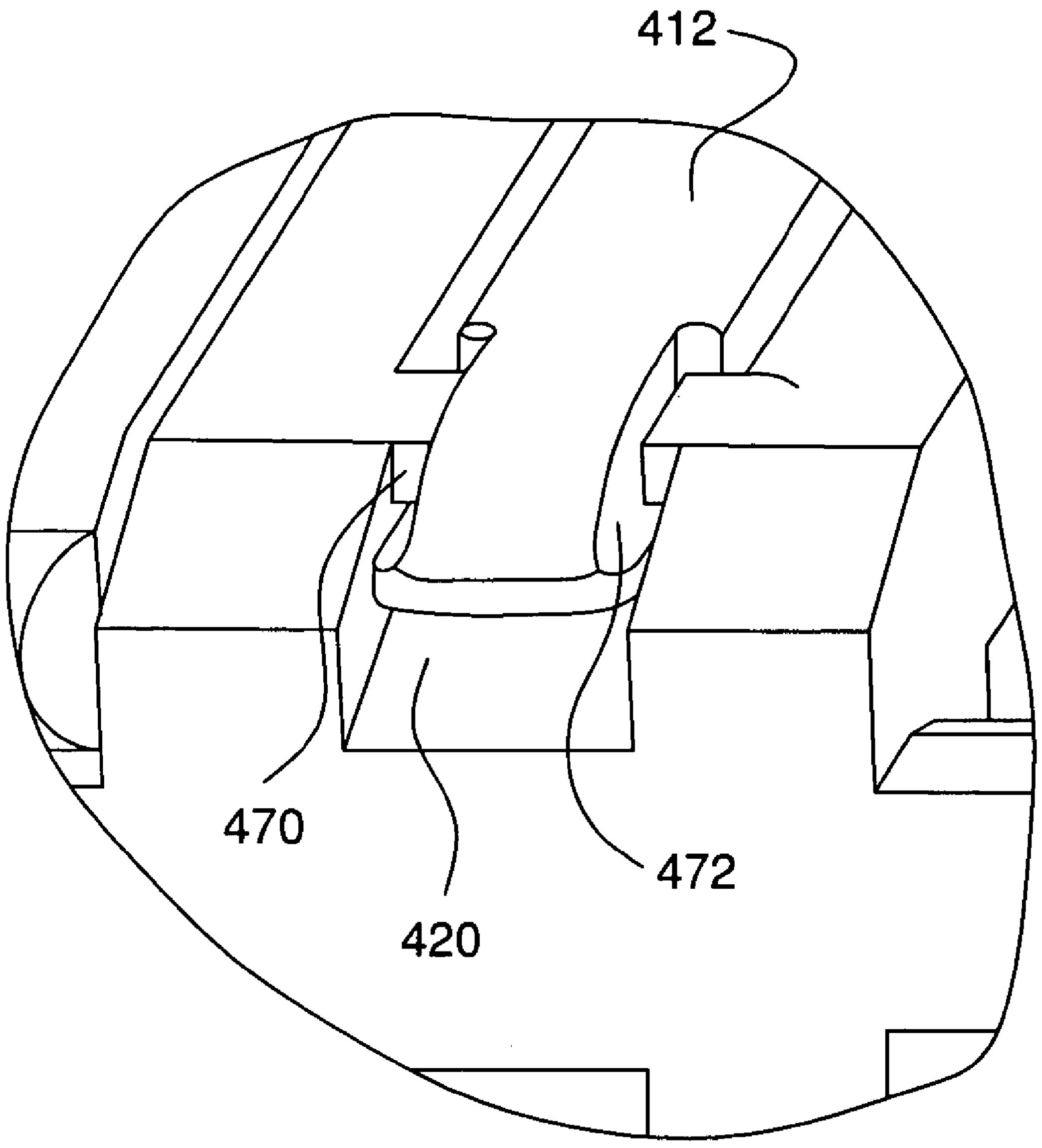
FIG. 28 is a detailed view of a signal contact inserted into a trough formed in an exemplary beam.

FIG. 27 provides a view of the front of plug housing 410. A portion of a beam 418 is shown in section so as to better illustrate signal contact 412 in trough 420. Also illustrated is projection 470 which extends from beam 428 into trough 420. FIG. 28 provides an enlarged view of a signal contact 412 fully inserted in trough 420. As shown, signal contact 412 has recesses or notches 472 formed therein. Projections 470 are located in notches 472 and thereby secure signal contact 412, and especially its distal end in place.

An alternative embodiment of plug 110 and receptacle 112 is depicted in FIGS. 29–34. In this particular exemplary embodiment, receptacle 112 is positioned against a bulkhead 512 which may be, for example, the periphery of an electronics device such as, for example, a computer. Jackscrews 516 and corresponding nuts 514 are employed to maintain physical and electrical connectivity between plug 110 and receptacle 112. A novel ground plate 520 contributes to the stability of receptacle 112.

Figure 29:
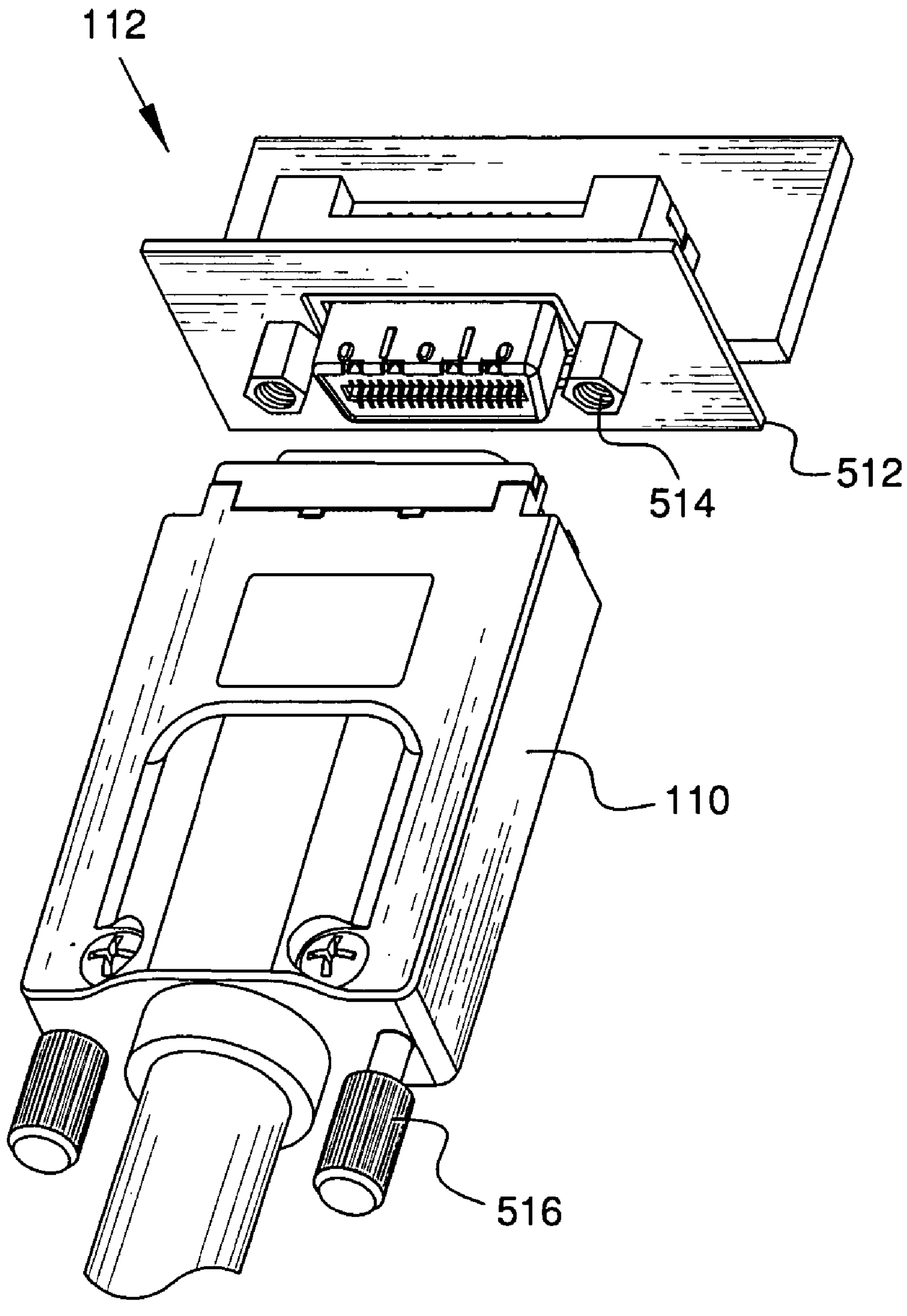
FIG. 29 is a front perspective view of an exemplary plug aligned for interconnection with an exemplary receptacle.

FIG. 29 provides a front perspective view of plug 110 aligned for interconnection with receptacle 112. As shown, receptacle 112 abuts, and extends through bulkhead 512. Nuts 514 likewise extend through bulkhead 512 and are made of a conducting material such as a metal. Nuts 514 are adapted to receive therein jackscrews 516 which extend from plug 110 and which are also manufactured from an electrically conducting material. When plug 110 is aligned with and inserted into receptacle 112, jackscrews 516 are inserted into nuts 514 and operate to secure plug 110 to receptacle 112. Electrical conductivity between jackscrews 516 and nuts 514 enhances the electrical shielding between plug 110 and receptacle 112.

Figure 30:
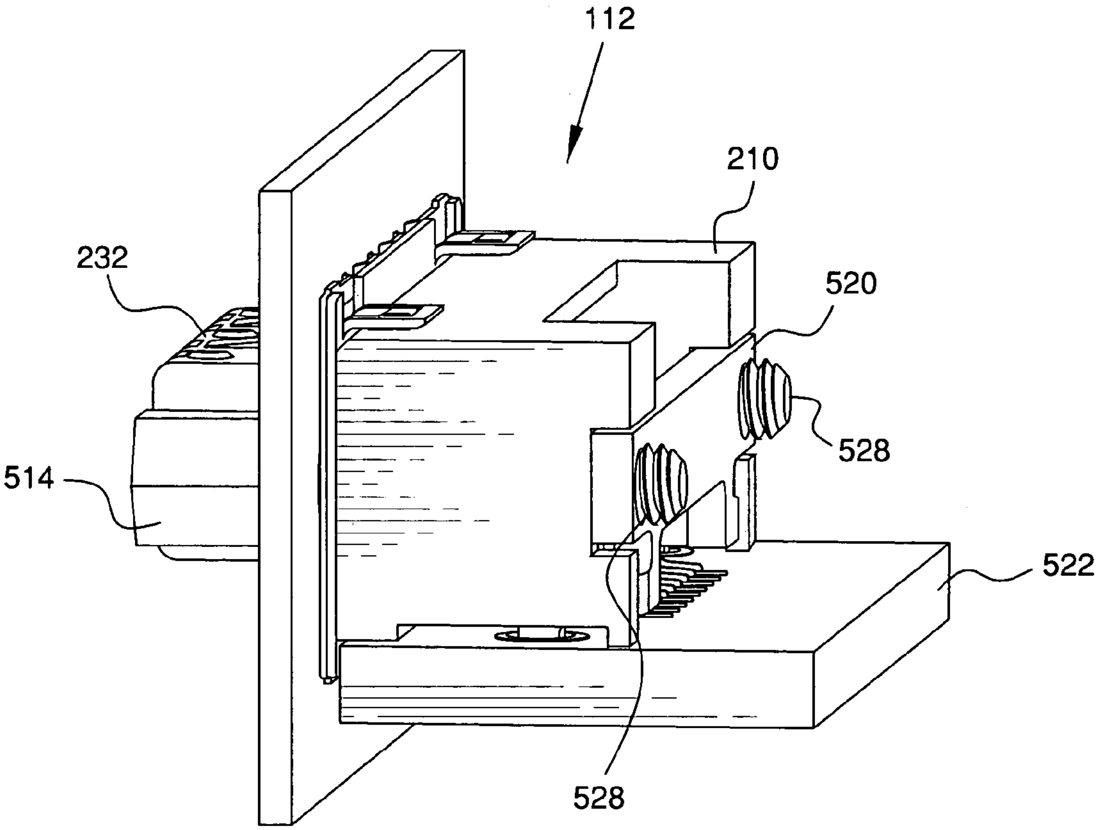
FIG. 30 is a rear perspective view of an exemplary receptacle.

FIG. 30 provides a rear perspective view of receptacle 112. As shown, receptacle 112 comprises a housing 210 and shielding shell 232 as described above. Receptacle 112 further comprises ground plate 520 which extends along the rear side, i.e. opposite the front side to which shielding shell 232 is attached, of housing 210. Ground plate 520 also extends into recesses formed in printed circuit board substrate 522. Housing 210 and shielding shell 232 extend through bulkhead 512. Nuts 514 extend through bulkhead 512, shielding shell 232, and housing 210, and interface with ground plate 520.

Figure 31:
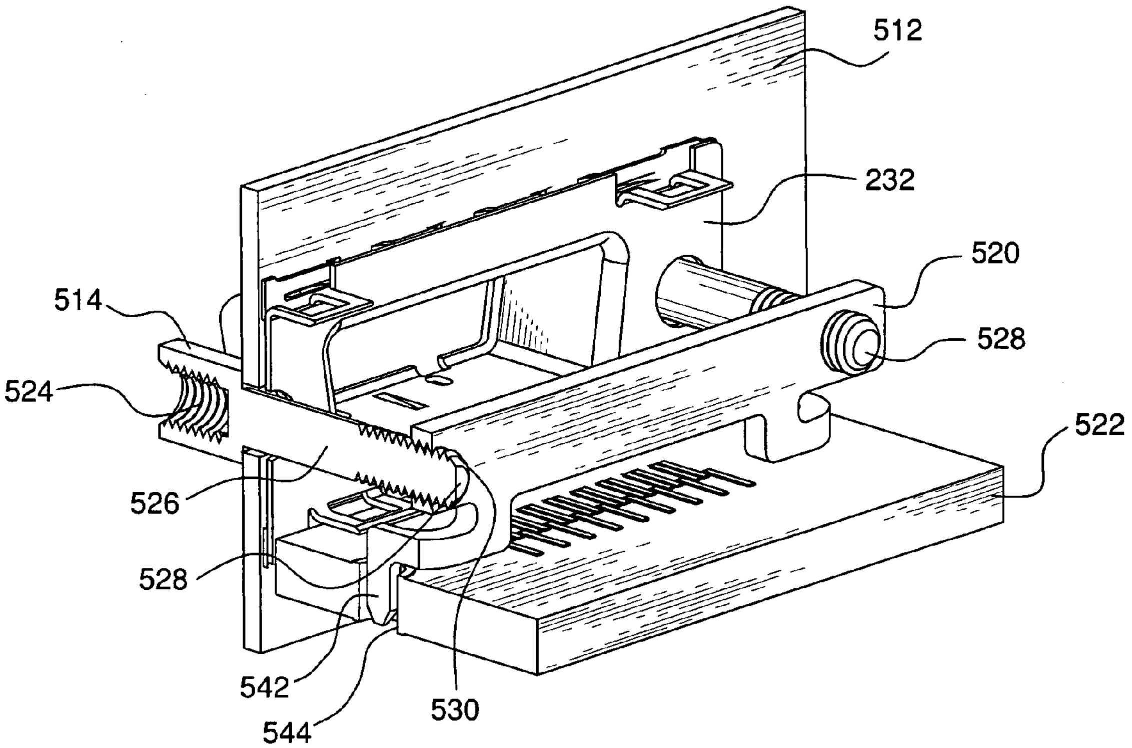
FIG. 31 is a rear, partially-sectional view of an exemplary receptacle.
Figure 32:
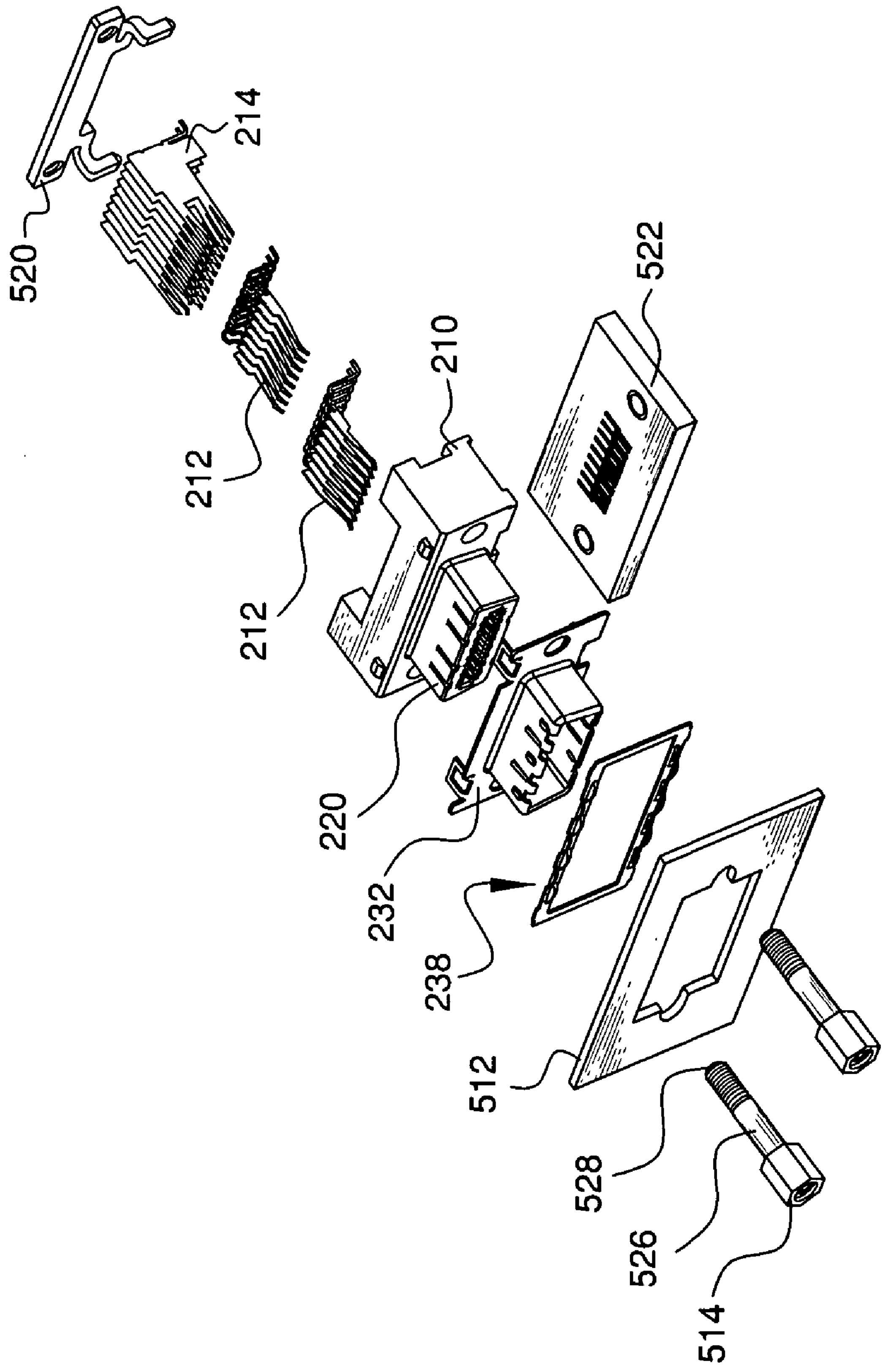
FIG. 32 is an exploded view of an exemplary receptacle.

FIG. 31 provides a rear perspective view of receptacle 112, with housing 210 not shown, and with one of the depicted nuts 514 and a portion of ground plate 520 shown in section. FIG. 32 provides an exploded perspective view of receptacle 112. As shown in FIG. 31, nuts 514 comprise a recessed area 524 for receiving a distal end (not shown) of jackscrews 516. Recessed area 524 has spiraled grooves formed therein for forming an interference fit with corresponding spiral grooves on the distal ends of jackscrews

516. A portion of nuts 514 abut bulkhead 512 and thereby apply pressure against bulkhead 512 to secure receptacle 112 to bulkhead 512.

Nuts 514 further comprise extension member 526 that extends through recesses formed in bulkhead 512, shielding shell 232, and housing 210, and interfaces with ground plate 520. As shown, distal end 528 of extension member 526 is situated in recess 530 formed in ground plate 520, and has spiraled grooves formed thereon for forming an interference fit with corresponding spiraled grooves in recess 530. Ground plate 520 extends into and is anchored in circuit board substrate 522, which provides electrical connectivity to a ground source. Nuts 514, including extension members 526, may be electrically conducting, as is ground plate 520. Accordingly, physical contact between nuts 514 and ground plate 520 provides electrical connectivity to a ground source accessed through substrate 522. Furthermore, as a consequence of nuts 514 abutting bulkhead 512 and interfacing with ground plate 520 that is seated in substrate 532, receptacle 112 is firmly positioned and less susceptible to forces that otherwise might interfere with electrical connection between receptacle 112 and substrate 532.

Figure 33:
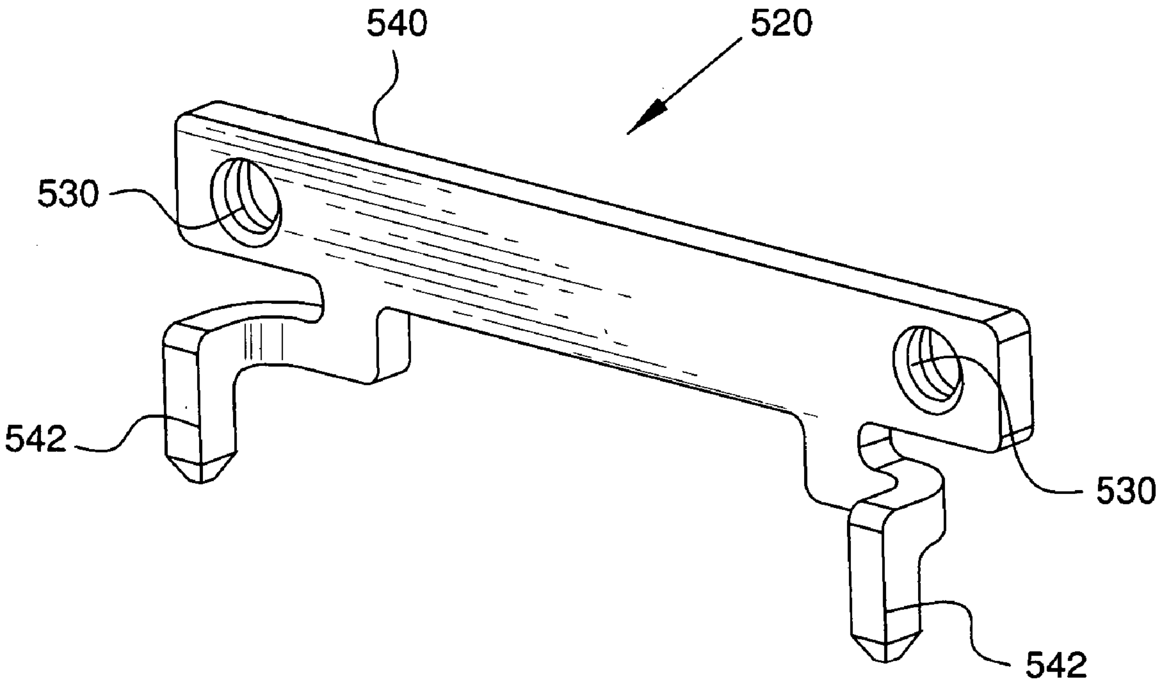
FIG. 33 is a front perspective view of an exemplary ground plate.

FIG. 33 provides a front perspective view of ground plate 520. Ground plate 520 comprises ground bar 540 and grounding projections 542. Ground bar 540 has two recesses 530 formed therein which are symmetrically distributed in ground bar 540 for receiving the distal ends 528 of extension members 526. Grounding projections 542 extend into recesses 544 formed in printed circuit board substrate 522. Recesses 544 preferably provide access to a ground source. As shown, projections 542 are offset forward toward the front of housing 210 and receptacle 112 and away from ground bar 540. In other words, projections 542 are offset toward the center of housing 210 and receptacle 112 relative to ground bar 540. As a result of this offset, projections 542 are located closer to the center of gravity of receptacle 112 which enhances the stability of receptacle 112 when receptacle 112 is attached to substrate 522. As should be appreciated, although two projections 524 are shown, ground plate 520 may include any number of projections. Generally, ground plate 520 is formed of a high strength conductive metal that can be soldered such as, for example, cold rolled steel (CRS).

Thus, an exemplary plug and receptacle have been disclosed. The exemplary devices have been especially designed to optimize electrical performance and can be consistently and practically manufactured. A plug and receptacle in accordance with the exemplary disclosed embodiments are ideal for use in Infiniband connection systems but may be used with other architectures or standards as well.

Modifications may be made to the above-described embodiments without departing from the spirit or essential attributes thereof. For example, the shape of the conduits formed through the plug housing may be different than that described above. Likewise, the contacts may be formed in shapes different than those illustrated herein. Indeed numerous variations may be made upon the disclosed embodiments. Accordingly, the present invention should not be limited to any single embodiment, but rather construed in breadth and scope in accordance with the recitation of the appended claims.

What is claimed:

1. A receptacle, comprising:

a housing, said housing comprising a body, a plug interface for receiving a plug, said plug interface projecting from said body, and a contact support member projecting from said body, said contact support member having at least a first pivot area and a second pivot area formed thereon; and at least a first signal contact and a second signal contact, each of said first signal contact and said second signal contact comprising a plug contact portion, a pivot member, and a tail portion, wherein said plug contact portion of each of said first and second signal contacts extends through a wall of said housing body extending substantially vertically relative to said contact support member and is exposed in said plug interface, and said pivot member of each of said first and second signal contacts abut said first and second pivot areas respectively causing said tail portion of said first signal contact to be substantially aligned with said tail portion of said second signal contact.

2. The receptacle of claim 1, wherein said contact support member has a plurality of slots formed therein and said first pivot area and said second pivot area are each formed in one of said plurality of slots.

3. The receptacle of claim 1, wherein each of said first pivot area and second pivot area forms an acute angle.

4. The receptacle of claim 1, wherein said tail portion of said first and second signal contacts are substantially aligned vertically and horizontally.

5. The receptacle of claim 1, wherein for each of said first signal contact and said second signal contact, said plug contact portion extends into said plug interface, said tail portion extends below said housing, and said pivot member is formed therebetween, said pivot member contacting one of said pivot areas.

6. The receptacle of claim 5, wherein said tail portion of each of said first signal contact and said second signal contact are aligned for mating with a device.

7. A receptacle, comprising:

a housing comprising a body and a contact support member that projects from said body; and an electrical contact comprising a plug contact portion, a pivot member, and a tail portion, wherein said plug contact portion of said electrical contact extends in a first direction through a wall of said body of said housing extending substantially vertically relative to said contact support member and a portion of said pivot member of said electrical contact abuts said contact support member, and movement of the plug contact portion of the electrical contact in said first direction causes said tail portion of said electrical contact to move with respect to said contact support member of said housing.

* * * * *